(12) United States Patent
Konishi et al.

(10) Patent No.: US 11,699,744 B2
(45) Date of Patent: Jul. 11, 2023

(54) SEMICONDUCTOR DEVICE AND SEMICONDUCTOR APPARATUS

(71) Applicant: Mitsubishi Electric Corporation, Tokyo (JP)

(72) Inventors: Kazuya Konishi, Tokyo (JP); Koichi Nishi, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 192 days.

(21) Appl. No.: 17/359,983

(22) Filed: Jun. 28, 2021

(65) Prior Publication Data

US 2022/0157976 A1 May 19, 2022

(30) Foreign Application Priority Data

Nov. 13, 2020 (JP) ................... 2020-189650

(51) Int. Cl.
| H01L 29/739 | (2006.01) |
| H01L 29/66  | (2006.01) |
| H01L 29/20  | (2006.01) |
| H01L 29/16  | (2006.01) |
| H01L 29/10  | (2006.01) |

(52) U.S. Cl.
CPC ...... *H01L 29/7397* (2013.01); *H01L 29/1095* (2013.01); *H01L 29/1602* (2013.01); *H01L 29/1608* (2013.01); *H01L 29/2003* (2013.01); *H01L 29/66348* (2013.01)

(58) Field of Classification Search
CPC ............. H01L 29/7397; H01L 29/1095; H01L 29/1602; H01L 29/1608; H01L 29/2003; H01L 29/66348

USPC .......................................................... 257/76
See application file for complete search history.

(56) References Cited

U.S. PATENT DOCUMENTS

| 10,096,700 B2 * | 10/2018 | Na ................. H01L 29/407 |
| 2014/0332845 A1 * | 11/2014 | Bobde ............. H01L 29/4238 438/138 |
| 2019/0088769 A1 | 3/2019 | Matsushita |

FOREIGN PATENT DOCUMENTS

| JP | 2017-147431 A | 8/2017 |
| JP | 2019-057702 A | 4/2019 |

* cited by examiner

*Primary Examiner* — Igwe U Anya
(74) *Attorney, Agent, or Firm* — Studebaker & Brackett PC

(57) ABSTRACT

A semiconductor device includes; a semiconductor substrate; an emitter electrode provided on the semiconductor substrate; a gate electrode provided on the semiconductor substrate; a drift layer of a first conduction type provided in the semiconductor substrate; a source layer of the first conduction type provided on an upper surface side of the semiconductor substrate; a base layer of a second conduction type provided on the upper surface side of the semiconductor substrate; a collector electrode provided below the semiconductor substrate; and a two-part dummy active trench including, at an upper part, an upper dummy part not connected with the gate electrode and including, at a lower part, a lower active part connected with the gate electrode and covered by an insulating film, in a trench of the semiconductor substrate, wherein a longitudinal length of the lower active part is larger than a width of the lower active part.

57 Claims, 25 Drawing Sheets

SEMICONDUCTOR DEVICE AND SEMICONDUCTOR APPARATUS

BACKGROUND OF THE INVENTION

Field

The present disclosure relates to a semiconductor device and a semiconductor apparatus.

Background

Patent Literature 1 discloses that, inside a trench, a gate conductive part connected with gate potential is positioned at an upper part, and a gate split part connected with emitter potential is positioned at a lower part. Japanese Patent Laid-Open No. 2017-147431 describes that the turn-on di/dt decreases and a turn-on loss can be reduced for the same the turn-on di/dt.

SUMMARY

The emitter of a p-side semiconductor device, the collector of which is connected with the high-potential side (p side) of a power source is connected with the collector of an n-side semiconductor device, the emitter of which is connected with the low-potential side (n side) of the power source in some cases. A load is connected with a connection point between the p-side semiconductor device and the n-side semiconductor device. Freewheeling diodes are connected with the p-side semiconductor device and the n-side semiconductor device, respectively. The freewheeling diode connected in antiparallel with the p-side semiconductor device is referred to as a p-side diode, and the freewheeling diode connected in antiparallel with the n-side semiconductor device is referred to as an n-side diode.

Recovery current flows to the n-side diode when the p-side semiconductor device is turned on while reflux current flows to the n-side diode. For example, the recovery dV/dt of the n-side diode changes in accordance with collector current of the p-side semiconductor device. Specifically, the recovery dV/dt of an n-side diode at a turn-on loss with low current in a p-side IGBT is larger than the recovery dV/dt of the p-side IGBT at rated current. A "low-current side" means that the collector current of a p-side semiconductor device is small, and a "rated-current side" means that the collector current of the p-side semiconductor device is large. The recovery dV/dt of an n-side diode is large when the collector current of the p-side semiconductor device is small, and the recovery dV/dt of the n-side diode is small when the collector current of the p-side semiconductor device is large.

When the recovery dV/dt of a diode has current dependency as described above, the following problem occurs. Specifically, the gate resistance of a semiconductor device is set so that a large recovery dV/dt has a predetermined value in some cases. Thus, for example, when the gate resistance is determined so that the recovery dV/dt on the low-current side is 20 kV/µs, dV/dt on the rated-current side (on which the turn-on loss is evaluated) is 10 kV/µs approximately. As a result, the semiconductor device has a long switching time, and the turn-on loss at turn-on (turn-on loss) increases. Thus, the turn-on loss increases when the recovery dV/dt of the diode has current dependency.

The inventor of the present application has found that it is effective to increase a value (Cgc/Cge) obtained by dividing gate-electrode-collector-electrode capacitance (Cgc) of a semiconductor device by gate-electrode-emitter-electrode capacitance (Cge) in order to reduce dependency of the recovery dV/dt of a freewheeling diode on the collector current of the semiconductor device. More specifically, increase of the recovery dV/dt at low current can be reduced by increasing the Cgc of the semiconductor device. In addition, the recovery dV/dt at large current (at rated current) can be increased by decreasing the Cge of the semiconductor device. The switching time can be shortened and the turn-on loss can be reduced by increasing the value of Cgc/Cge.

A conventional technology has a two-part gate structure in which polysilicon is divided two parts of an upper part and a low part inside a trench. Specifically, the two-part gate structure has a configuration including a lower active part connected with a gate electrode, and an upper dummy part having a lower part connected with an emitter electrode. Accordingly, Cgc decreases and the ratio Cgc/Cge decreases. Thus, the turn-on loss increases when the gate resistance of a semiconductor device is set so that a large recovery dV/dt has a predetermined value, which has been a problem.

The present disclosure is intended to solve the above-described problem and provide a semiconductor device and a semiconductor apparatus that can increase the ratio Cgc/Cge to reduce dependency of the recovery dV/dt of a freewheeling diode on the collector current of the semiconductor device, thereby reducing the turn-on loss.

A semiconductor device according to the present disclosure includes: a semiconductor substrate; an emitter electrode provided on the semiconductor substrate; a gate electrode provided on the semiconductor substrate; a drift layer of a first conduction type provided in the semiconductor substrate; a source layer of the first conduction type provided on an upper surface side of the semiconductor substrate; a base layer of a second conduction type provided on the upper surface side of the semiconductor substrate; a collector electrode provided below the semiconductor substrate; and a two-part dummy active trench including, at an upper part, an upper dummy part not connected with the gate electrode and including, at a lower part, a lower active part connected with the gate electrode and covered by an insulating film, in a trench of the semiconductor substrate, wherein a longitudinal length of the lower active part is larger than a width of the lower active part.

In the present disclosure, the trench including a dummy part at an upper part and an active par at a lower part is provided. Thus, the turn-on loss can be reduced.

Other and further objects, features and advantages of the invention will appear more fully from the following description.

DESCRIPTION OF EMBODIMENTS

A semiconductor device and a semiconductor apparatus according to an embodiment will be described below with reference to the accompanying drawings. Components identical or corresponding to each other are denoted by the same reference sign, and duplicate description thereof is omitted in some cases. In the following description, "n" and "p" indicate conduction types of a semiconductor, and the n type is a first conduction type and the p type is a second conduction type in the present disclosure. The conduction types may be inverted. In addition, "n–" indicates that impurity concentration is lower than that of "n", and "n+" indicates that impurity concentration is higher than that of "n". Similarly, "p–" indicates that impurity concentration is lower than that of "p", and "p+" indicates that impurity concentration is higher than that of p.

First Embodiment

Figure 1:
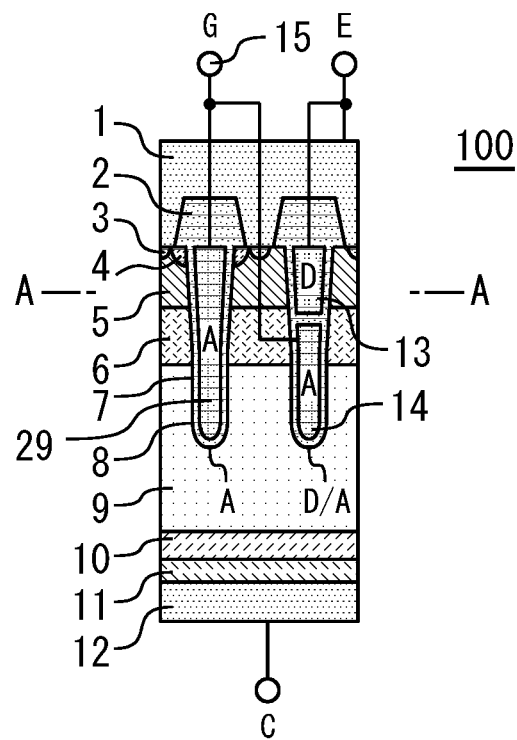
FIG. 1 is a cross-sectional view of a semiconductor device according to a first embodiment.

FIG. 1 is a cross-sectional view of a semiconductor device 100 according to a first embodiment. The semiconductor device is configured as an insulated gate bipolar transistor (hereinafter abbreviated as IGBT). As illustrated in FIG. 1, the semiconductor device 100 includes an active trench A. The active trench A includes a gate insulating film 8 provided along a trench 7 of a semiconductor substrate, and an active part 29 provided in contact with the gate insulating film 8 and connected with a gate electrode 15. The gate insulating film 8 is, for example, an oxide film. A trench means a hole provided in the semiconductor substrate or a structure formed in the hole.

A two-part dummy active trench D/A is provided at the semiconductor substrate. Inside the trench 7 of the semiconductor substrate, the two-part dummy active trench D/A includes, at an upper part, an upper dummy part 13 not connected with the gate electrode 15 and includes, at a lower part, a lower active part 14 connected with the gate electrode 15. The upper dummy part 13 and the lower active part 14 are each covered by the gate insulating film 8 so that the parts are electrically separated from each other. In an example, the upper dummy part 13 is connected with an emitter electrode 1.

Figure 2:
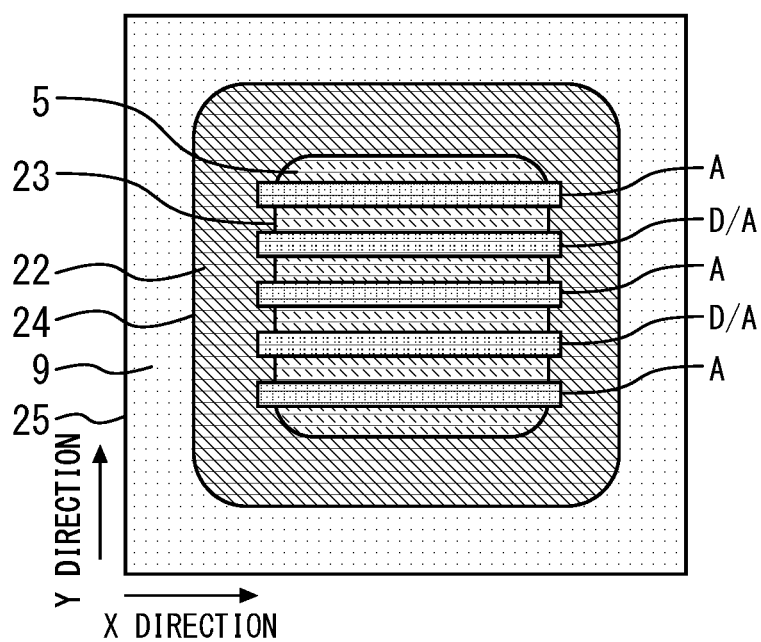
FIG. 2 is a plan view of the semiconductor device.

FIG. 2 is a plan view of the semiconductor device 100 at a depth illustrated with line A-A in FIG. 1 and including a p-type base layer 5. FIG. 2 illustrates a terminal end region 24 and an outer peripheral region 25, which are not illustrated in FIG. 1. As illustrated in FIG. 2, the active trench A and the two-part dummy active trench D/A are provided in stripes in plan view. The two-part dummy active trench D/A and the active trench A are formed in a cell region 23 in which a base layer 5 is formed in plan view. In another example, plane disposition of the two-part dummy active trench D/A may be in a mesh shape with intersections or an island shape with points instead of straight lines such as stripes.

A gate pad may be provided at part of the cell region 23 in plan view of the semiconductor device 100. The gate pad is connected with a gate electrode formed on the semiconductor substrate.

As illustrated in FIG. 1, an $n^+$-type source layer 4 is provided in contact with the gate insulating film 8 on both sides of the active trench A in a width direction. A $p^+$-type contact layer 3 is provided between the trenches 7 adjacent to each other. Note that the $n^+$-type source layer 4 and the $p^+$-type contact layer 3 may be alternately provided in the direction in which the active trench A extends.

As illustrated in FIG. 1, the semiconductor device includes an $n^-$-type drift layer 9. The semiconductor substrate ranges from the $n^+$-type source layer 4 and the $p^+$-type contact layer 3 to a p-type collector layer 11 in FIG. 1. In FIG. 1, the upper ends of the $n^+$-type source layer 4 and the $p^+$-type contact layer 3 are referred to as a first principal surface of the semiconductor substrate, and lower ends of the p-type collector layer 11 are referred to as a second principal surface of the semiconductor substrate. The first principal surface of the semiconductor substrate is a principal surface on a front surface side of the semiconductor device 100, and the second principal surface of the semiconductor substrate is a principal surface on a back surface side of the semiconductor device 100. The semiconductor device 100 includes the $n^-$-type drift layer 9 between the first principal surface and the second principal surface facing the first principal surface in an IGBT region as a cell region.

As illustrated in FIG. 1, in the IGBT region, an n-type carrier accumulation layer 6 having n-type impurity concentration higher than that of the $n^-$-type drift layer 9 is provided on the first principal surface side of the $n^-$-type drift layer 9. The carrier accumulation layer 6 of the first conduction type is provided between the base layer 5 and the drift layer 9. The n-type carrier accumulation layer 6 has lower impurity concentration of the first conduction type than that of the source layer 4 and has higher impurity concentration of the first conduction type than that of the drift layer 9. The n-type carrier accumulation layer 6 thus provided can reduce a conduction loss when current flows. The n-type carrier accumulation layer 6 and the $n^-$-type drift layer 9 may be collectively referred to as a drift layer. Note that no n-type carrier accumulation layer 6 may be provided in the semiconductor device 100, and instead, the $n^-$-type drift layer 9 may be provided in the region of the n-type carrier accumulation layer 6 illustrated in FIG. 1.

The n-type carrier accumulation layer 6 is formed through ion injection of n-type impurities into the semiconductor substrate configured as the $n^-$-type drift layer 9, and thereafter, through annealing to diffuse the injected n-type impurities in the semiconductor substrate as the $n^-$-type drift layer 9.

The p-type base layer 5 is provided on the first principal surface side of the n-type carrier accumulation layer 6. The p-type base layer 5 is in contact with the gate insulating film 8 of the active trench A. The $n^+$-type source layer 4 is provided in contact with the gate insulating film 8 of the active trench A on the first principal surface side of the p-type base layer 5, and the $p^+$-type contact layer 3 is provided in the remaining region. The upper ends of the $n^+$-type source layer 4 and the $p^+$-type contact layer 3 serve as the first principal surface of the semiconductor substrate. Note that the $p^+$-type contact layer 3 is a region having p-type impurity concentration higher than that of the p-type base layer 5. The $p^+$-type contact layer 3 and the p-type base layer 5 may be individually referred to when the layers need to be distinguished from each other. The $p^+$-type contact layer 3 and the p-type base layer 5 may be collectively referred to as a p-type base layer.

The semiconductor device 100 also includes, on the second principal surface side of the $n^-$-type drift layer 9, an n-type buffer layer 10 having n-type impurity concentration higher than that of the $n^-$-type drift layer 9. The n-type buffer layer 10 is provided to prevent punch-through of a depleted layer extending on the second principal surface side from the p-type base layer 5 when the semiconductor device 100 is in the off-state. The n-type buffer layer 10 may be formed by injecting, for example, phosphorus (P) or proton (H+) or may be formed by injecting both phosphorus (P) and proton (H+). Note that no n-type buffer layer 10 may be provided in the semiconductor device 100, and instead, the $n^-$-type drift layer 9 may be also provided in the region of the n-type buffer layer 10 illustrated in FIG. 1. The n-type buffer layer 10 and the $n^-$-type drift layer 9 may be collectively referred to as a drift layer.

In the semiconductor device 100, the p-type collector layer 11 is provided on the second principal surface side of the n-type buffer layer 10. In other words, the p-type collector layer 11 is provided between the $n^-$-type drift layer 9 and the second principal surface.

As illustrated in FIG. 1, each trench 7 extending from the first principal surface of the semiconductor substrate to the $n^-$-type drift layer 9 through the p-type base layer 5 is formed in the semiconductor device 100. The active trench A has a configuration in which the active part 29 is provided in a trench 7 through the gate insulating film 8. The gate insulating film 8 of the active trench A is in contact with the p-type base layer 5 and the $n^+$-type source layer 4. When gate drive voltage is applied to the active part 29, a channel is formed in the p-type base layer 5 in contact with the gate insulating film 8 of the active trench A.

Another trench 7 is arranged to provide the two-part dummy active trench D/A. The two-part dummy active trench D/A has a configuration in which the upper dummy part 13 and the lower active part 14 are provided through the gate insulating film 8. The lower active part 14 faces the $n^-$-type drift layer 9 through the gate insulating film 8. The upper dummy part 13 faces the p-type base layer 5 through the gate insulating film 8. As illustrated in FIG. 1, an interlayer insulating film 2 is provided on the active part 29 of the active trench A. The emitter electrode 1 is formed on a region in which the interlayer insulating film 2 is not provided on the first principal surface of the semiconductor substrate, and the emitter electrode 1 is also formed on the interlayer insulating film 2.

In an example, as illustrated in FIG. 1, the upper end of the lower active part 14 is positioned lower than the lower end of the base layer 5. In other words, the upper end of the lower active part 14 does not reach the base layer 5. When the lower active part 14 is in the base layer 5, the potential of the base layer 5 varies due to holes injected into the p-type base layer 5 at turn-on, displacement current flows from the base layer 5 to the lower active part 14, and dV/dt controllability degrades. Thus, as in the above-described example, the upper end of the lower active part 14 is set not to reach the base layer 5 so that flow of displacement current into the lower active part 14 can be prevented.

In another example, as illustrated in FIG. 1, the longitudinal length of the lower active part 14 in the carrier accumulation layer 6 is shorter than the longitudinal length of the lower active part 14 in the drift layer 9. In other words, the length of the lower active part 14 in the drift layer 9 is longer than the length of the lower active part 14 in the carrier accumulation layer 6. There is a limit on extension of the length of the lower active part 14 in the carrier accumulation layer 6 because a too large depth of the carrier accumulation layer 6 strengthens electric field below the carrier accumulation layer 6 and decreases withstand voltage. Thus, the length of the lower active part 14 in the drift layer 9 is extended to increase Cgc with less adverse influence of withstand voltage decrease.

As illustrated in FIG. 1, the emitter electrode 1 is electrically connected with the n$^+$-type source layer 4, the p$^+$-type contact layer 3, and the upper dummy part 13 in ohmic contact.

Although the interlayer insulating film 2 is provided on the upper dummy part 13 in FIG. 1, no interlayer insulating film 2 may be provided and the emitter electrode 1 may be directly formed on the upper dummy part 13. When the interlayer insulating film 2 is formed on the upper dummy part 13 of the two-part dummy active trench D/A as illustrated in FIG. 1, the emitter electrode 1 and the upper dummy part 13 may be electrically connected with each other at another section.

In an example, the emitter electrode 1 may be formed of an aluminum alloy such as an aluminum silicon alloy (Al—Si alloy). In another example, the emitter electrode 1 may be made of a multi-layer metal film in which a plated film is formed by non-electrolytic plating or electrolytic plating on an electrode formed of an aluminum alloy. The plated film formed by non-electrolytic plating or electrolytic plating may be, for example, a nickel (Ni) plated film. When there is a minute region, such as a region between the interlayer insulating films 2 adjacent to each other, in which favorable embedding cannot be obtained with the emitter electrode 1, tungsten, which has a more favorable embedding property than that of the emitter electrode 1, may be provided in the minute region and the emitter electrode 1 may be provided on the tungsten.

A barrier metal may be provided between the interlayer insulating film 2 and the emitter electrode 1. The barrier metal may be, for example, a conductive body containing titanium (Ti) and may be, for example, titanium nitride or TiSi as an alloy of titanium and silicon (Si). The barrier metal may be provided only on an n-type semiconductor layer such as the n$^+$-type source layer 4. The barrier metal and the emitter electrode 1 may be collectively referred to as an emitter electrode.

A collector electrode 12 is provided on the second principal surface side of the p-type collector layer 11. The collector electrode 12 is formed below the semiconductor substrate. Similarly to the emitter electrode 1, the collector electrode 12 may be made of an aluminum alloy or may be made of an aluminum alloy and a plated film. The collector electrode 12 may have a configuration different from that of the emitter electrode 1. The collector electrode 12 is electrically connected with the p-type collector layer 11 in ohmic contact.

Manufacturing Method

Subsequently, an exemplary method of manufacturing the semiconductor device according to the first embodiment will be described below.

First, the semiconductor substrate as the n$^-$-type drift layer 9 is prepared. The semiconductor substrate may be, for example, a so-called FZ wafer produced by a floating zone (FZ) method or a so-called MCZ wafer produced by a magnetic applied Czochralki (MCZ) method and may be an n-type wafer containing n-type impurities. The concentration of n-type impurities contained in the semiconductor substrate is selected as appropriate depending on the withstand voltage of a semiconductor apparatus to be produced. For example, for a semiconductor apparatus having a withstand voltage of 1200 V, the n-type impurity concentration is adjusted so that the n$^-$-type drift layer 9 as the semiconductor substrate has a specific resistance of 40 to 120 Ω·cm approximately. During the process of preparing the semiconductor substrate, the entire semiconductor substrate is the n$^-$-type drift layer 9. However, a p-type or n-type semiconductor layer is formed as p-type or n-type impurity ions are injected from the first principal surface side or the second principal surface side of the semiconductor substrate and then diffused in the semiconductor substrate through thermal treatment or the like, and accordingly, the semiconductor device 100 is manufactured.

As illustrated in FIG. 2, a region as the terminal end region 24 is provided around the cell region 23. The terminal end region 24 of the semiconductor device 100 may be produced by a well-known manufacturing method although the following description is mainly made on a method of manufacturing the configuration of the cell region 23 of the semiconductor device 100. For example, when an FLR including a p-type terminal end well layer 22 as a withstand-voltage holding structure is to be formed in the terminal end region 24, p-type impurity ions may be injected to form the FLR before fabrication of the cell region 23 of the semiconductor device 100, or p-type impurity ions may be injected to form the FLR simultaneously with ion injection of p-type impurities into the cell region 23 of the semiconductor device 100.

Subsequently, n-type impurities such as phosphorus (P) are injected from the first principal surface side of the semiconductor substrate to form the n-type carrier accumulation layer 6. In addition, p-type impurities such as boron (B) are injected from the first principal surface side of the semiconductor substrate to form the p-type base layer 5. The n-type carrier accumulation layer 6 and the p-type base layer 5 are formed by diffusing the impurity ions through thermal treatment after the impurity ion injection into the semiconductor substrate. The ion injection of the n-type and p-type impurities is performed after mask processing is provided on the first principal surface of the semiconductor substrate, and thus the layers are selectively formed on the first principal surface side of the semiconductor substrate. The n-type carrier accumulation layer 6 and the p-type base layer 5 are formed in the cell region 23 and connected with the p-type terminal end well layer 22 in the terminal end region 24. Note that mask processing is processing of forming a mask on the semiconductor substrate to apply resist on the semiconductor substrate, form an opening in a predetermined region of the resist by using a photoengraving technology, and provide ion injection and etching in the predetermined region of the semiconductor substrate through the opening.

Subsequently, n-type impurities are selectively injected on the first principal surface side of the p-type base layer 5 in the cell region 23 through mask processing to form the n$^+$-type source layer 4. The injected n-type impurities may be, for example, arsenic (As) or phosphorus (P).

Subsequently, each trench 7 extending from the first principal surface side of the semiconductor substrate to the n$^-$-type drift layer 9 through the p-type base layer 5 and the carrier accumulation layer 6 is formed. In the cell region 23, a sidewall of the trench 7 penetrating through the n$^+$-type source layer 4 serves as part of the n$^+$-type source layer 4.

The trench 7 can be formed by accumulating an oxide film of SiO2 or the like on the semiconductor substrate, forming an opening through the oxide film at a part where the trench 7 is to be formed through mask processing, and etching the semiconductor substrate by using, as a mask, the oxide film through which the opening is formed.

Subsequently, the semiconductor substrate is heated in an atmosphere containing, for example, oxygen to form the gate insulating film 8 on an inner wall of the trench 7 and the first principal surface of the semiconductor substrate. The gate insulating film 8 formed on the first principal surface of the semiconductor substrate is removed through a later process.

Subsequently, polysilicon doped with n-type or p-type impurities is accumulated in the trench 7, on the inner wall of which the gate insulating film 8 is formed, through chemical vapor deposition (CVD) or the like.

Subsequently, a mask opened at a part corresponding to the two-part dummy active trench D/A is formed through mask processing, and the polysilicon in the two-part dummy active trench D/A is etched to a desired depth, thereby forming the lower active part 14.

Subsequently, the semiconductor substrate is heated in an atmosphere containing, for example, oxygen to form the gate insulating film 8 on the inner wall of the two-part dummy active trench D/A and the lower active part 14, and then polysilicon doped with n-type or p-type impurities is accumulated through CVD or the like, thereby forming the upper dummy part 13.

Subsequently, the interlayer insulating film 2 is formed on the active trench A and the two-part dummy active trench D/A in the cell region 23, and then the gate insulating film formed on the first principal surface of the semiconductor substrate is removed. The interlayer insulating film 2 may be made of, for example, SiO2. Then, a contact hole is formed in the interlayer insulating film 2 accumulated through mask processing. The contact hole is formed on the n$^+$-type source layer 4 and the p$^+$-type contact layer 3.

Subsequently, the emitter electrode 1 on the first principal surface of the semiconductor substrate and the interlayer insulating film 2 may be formed by accumulating an aluminum silicon alloy (Al—Si alloy) through a PVD such as sputtering or evaporation coating. In addition, a nickel alloy (Ni alloy) may be formed as the emitter electrode 1 on the formed aluminum silicon alloy by non-electrolytic plating or electrolytic plating. When the emitter electrode 1 is formed by plating, a thick metal film can be easily formed as the emitter electrode 1, and thus the heat capacity of the emitter electrode 1 can be increased to improve thermal resistance. Note that when a nickel alloy is additionally formed through plating processing after the formation of the emitter electrode 1 made of an aluminum silicon alloy through PVD, the plating processing for forming the nickel alloy may be performed after fabrication of the second principal surface side of the semiconductor substrate.

Subsequently, the second principal surface side of the semiconductor substrate is ground to reduce the thickness of the semiconductor substrate to a designed predetermined thickness. The thickness of the semiconductor substrate after the grinding may be, for example, 80 µm to 200 µm.

Subsequently, the n-type buffer layer 10 is formed by injecting n-type impurities from the second principal surface side of the semiconductor substrate. In addition, the p-type collector layer 11 is formed by injecting p-type impurities from the second principal surface side of the semiconductor substrate. The n-type buffer layer 10 may be formed by injecting, for example, phosphorus (P) ions. Alternatively, the n-type buffer layer 10 may be formed by injecting protons (H+). Alternatively, the n-type buffer layer 10 may be formed by injecting both protons and phosphorus ions. Protons can be injected from the second principal surface of the semiconductor substrate to a deep position with relatively low acceleration energy. A depth to which protons are to be injected can be relatively easily changed by changing the acceleration energy. Thus, when the n-type buffer layer 10 is formed of protons, the n-type buffer layer 10 having a larger width in the thickness direction of the semiconductor substrate than in a case of formation with phosphorus ions can be formed by performing injection a plurality of times while changing the acceleration energy. In addition, the activation rate as n-type impurities can be high for phosphorus ions as compared to protons, and thus it is possible to more reliably prevent punch-through of the depleted layer in the semiconductor substrate, the thickness of which is reduced by forming the n-type buffer layer 10 of phosphorus. To further reduce the thickness of the semiconductor substrate, the n-type buffer layer 10 is preferably formed by injecting both protons and phosphorus ions, and in this case, protons are injected to a deeper position from the second principal surface than phosphorus ions.

The p-type collector layer 11 may be formed by injecting, for example, boron (B) ions. After the ion injection from the second principal surface side of the semiconductor substrate, the injected boron ions are activated through laser annealing by irradiating the second principal surface with a laser, thereby forming the p-type collector layer 11. In this case, phosphorus ions for the n-type buffer layer 10, which are injected to a relatively shallow position from the second principal surface of the semiconductor substrate are simultaneously activated. However, protons are activated at a relatively low anneal temperature of 380° C. to 420° C., and thus after protons are injected, the temperature of the entire semiconductor substrate needs to be prevented from increasing to a temperature higher than 380° C. to 420° C. except for a process for proton activation. The laser annealing can heat only the vicinity of the second principal surface of the semiconductor substrate to a high temperature, and thus can be used to activate n-type or p-type impurities even after proton injection.

Subsequently, the collector electrode 12 is formed on the second principal surface of the semiconductor substrate. The collector electrode 12 may be formed by accumulating an aluminum silicon alloy (Ai-Si alloy), titanium (Ti), or the like through PVD such as sputtering or evaporation coating, or may be formed by stacking a plurality of metals such as an aluminum silicon alloy, titanium, nickel, and gold. Alternatively, a metal film may be formed, by non-electrolytic plating or electrolytic plating, as the collector electrode 12 on a metal film formed through PVD.

The semiconductor device 100 is produced through the above-described process. Since a plurality of the semiconductor devices 100 are produced in a matrix in one n-type wafer, the wafer is cut into the individual semiconductor devices 100 by laser dicing or blade dicing, which completes production of each semiconductor device 100.

Operation

The inventor of the present application has found that it is effective to increase a value (Cgc/Cge) obtained by dividing gate-electrode-collector-electrode capacitance (Cgc) of a semiconductor device by gate-electrode-emitter-electrode capacitance (Cge) in order to reduce dependency of the recovery dV/dt of a freewheeling diode on the collector current of the semiconductor device. More specifically, increase of the recovery dV/dt at low current can be reduced by increasing the Cgc of the semiconductor device. In addition, the recovery dV/dt at large current (at rated current) can be increased by decreasing the Cge of the semiconductor device. The switching time can be shortened and the turn-on loss can be reduced by increasing the value of Cgc/Cge. The semiconductor device according to the first embodiment is manufactured based on this knowledge.

First, generation places of the Cgc and the Cge in the active trench A are briefly described. The generation place of the Cgc is a region in which the active trench A contacts the p-type base layer 5 connected with the emitter electrode 1. The generation place of the Cge is a region in which the active trench A contacts the $n^-$-type drift layer 9 and the n-type carrier accumulation layer 6.

Thus, to increase only the Cgc without increasing the Cge, only the region in which the active trench A contacts the $n^-$-type drift layer 9 needs to be increased without increasing the region in which the active trench A contacts the p-type base layer 5 connected with the emitter electrode 1.

Subsequently, a case of the two-part dummy active trench D/A will be described below. Since the upper dummy part 13 as a region in which the two-part dummy active trench D/A contacts the p-type base layer 5 is connected with the emitter electrode 1, no Cge is generated. Since the lower active part 14 as a region in which the two-part dummy active trench D/A contacts the $n^-$-type drift layer 9 is connected with the gate electrode 15, the Cgc is generated. For example, setting the longitudinal length of the lower active part 14 to be longer than the longitudinal length of the upper dummy part 13 contributes to increase of the Cgc.

Since the two-part dummy active trench D/A is employed in the first embodiment, the Cgc can be increased as compared to a semiconductor device including no two-part dummy active trench D/A. Thus, the ratio Cgc/Cge can be increased. Accordingly, dependency of the recovery dV/dt of the freewheeling diode on the collector current of the semiconductor device can be reduced.

Modification 1

Figure 3:
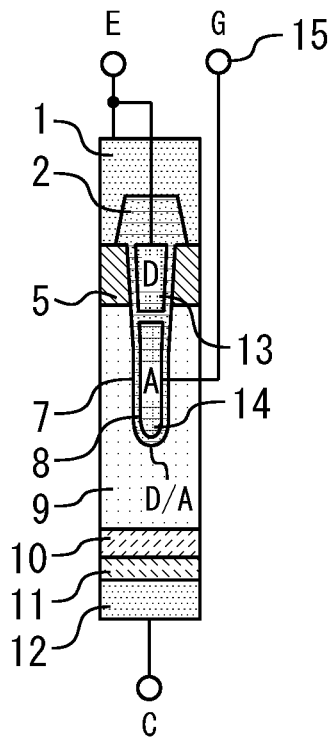
FIG. 3 is a cross-sectional view of a semiconductor device according to another example.
Figure 4:
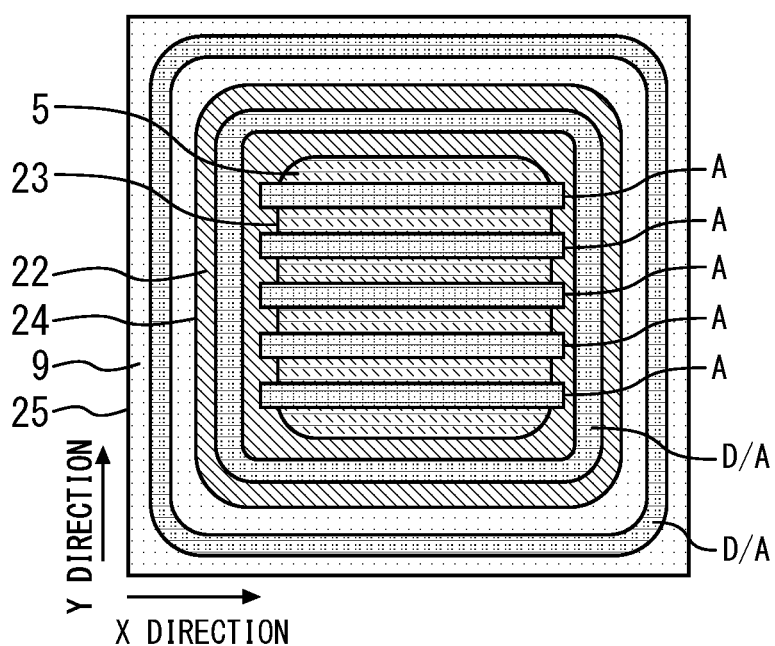
FIG. 4 is a plan view of the semiconductor device.

Although the two-part dummy active trench D/A is formed in the cell region 23 in the first embodiment, the two-part dummy active trench D/A may be formed in a region other than the cell region 23. FIG. 3 is a cross-sectional view of a semiconductor device according to a modification. The two-part dummy active trench D/A illustrated in FIG. 3 may be formed in a region other than the cell region 23. FIG. 4 is a plan view illustrating an exemplary arrangement of the two-part dummy active trench D/A. FIG. 4 illustrates that the two-part dummy active trench D/A is formed in the terminal end region 24 and the outer peripheral region 25. The terminal end region 24 surrounds the cell region 23 in plan view. The outer peripheral region 25 surrounds the terminal end region 24. The two-part dummy active trench D/A may be formed in a gate pad region in the cell region 23. The two-part dummy active trench D/A has a rectangular shape in FIG. 4 but may have a stripe shape of a straight line pattern, a mesh shape of an intersection pattern, or an island shape of a point pattern.

As an effect unique to the present modification, conduction performance can be improved since the two-part dummy active trench D/A is not provided in the cell region 23, and thus the density of active trenches A in the cell region 23 can be increased to have a higher channel density.

Modification 2

As understood from the description so far, in order to increase the Cgc, it is effective to increase the depth of each trench 7, thereby increasing the regions in which the active trench A and the two-part dummy active trench D/A contact the $n^-$-type drift layer 9.

Figure 5:
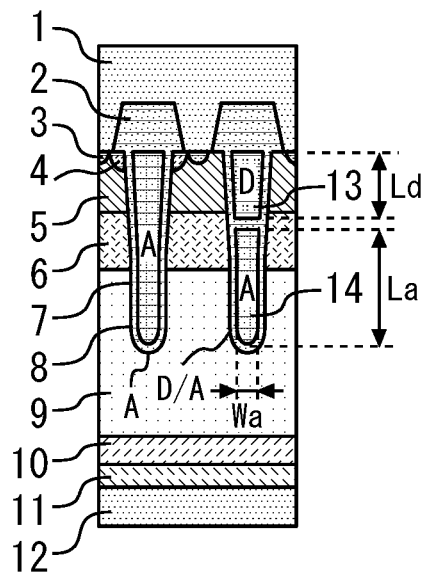
FIG. 5 is a cross-sectional view of a semiconductor device according to another example.

FIG. 5 is a cross-sectional view of a semiconductor device according to Modification 2. A length La of the lower active part 14 in the trench depth direction is longer than a length Ld of the upper dummy part 13 in the same direction. Thus, La>Ld holds. In an example, the longitudinal length La of the lower active part 14 is larger than a width Wa of the lower active part 14 in the lateral direction, in other words, La>Wa holds.

When the length La of the lower active part 14 is longer than the length Ld of the upper dummy part 13, the Cgc generated at the lower active part 14 can be increased, in particular. In addition, when the length La of the lower active part 14 is larger than the width Wa of the lower active part 14 in the lateral direction, the Cgc can be efficiently further increased. This is because the number of surfaces contacting the drift layer 9 is one for a bottom surface of the trench 7 but the number of surfaces contacting the drift layer 9 is two for the sidewall of the trench 7, and thus increase of the area of the sidewall efficiently increases the Cgc. Thus, the Cgc can be efficiently increased by increasing the aspect ratio of the lower active part 14.

The position of the lower end of the lower active part 14 can be separated from the n-type carrier accumulation layer 6, to which electric field concentration is likely to occur, or the p-type base layer 5, to which punch-through is likely to occur, by increasing the length of the lower active part 14. Accordingly, an effect as a withstand-voltage holding field plate can be increased.

Figure 6:
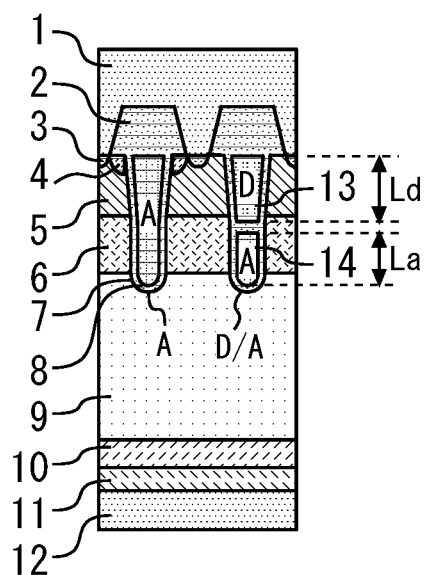
FIG. 6 is a cross-sectional view of a semiconductor device according to another example.

In another example, the length La of the lower active part 14 may be shorter than a length Lb of the upper dummy part as illustrated in FIG. 6. In this case, La<Ld holds. As the length La of the lower active part 14 is shortened, the Cgc generated at the lower active part 14 decreases but the time of etching for forming the trench 7 is shortened, which decreases process cost.

Modification 3

In order to increase the ratio Cgc/Cge, it is also effective to decrease the Cge. As understood from the description so far, in order to decrease the Cge, it is effective to reduce the region in which the active trench A contacts the p-type base layer 5.

Figure 7:
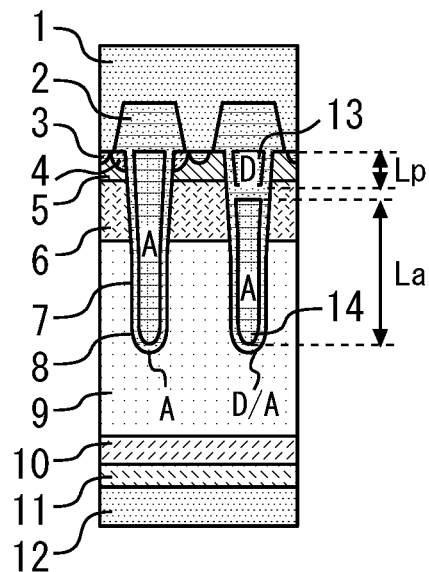
FIG. 7 is a cross-sectional view of a semiconductor device according to another example.

FIG. 7 is a cross-sectional view of a semiconductor device according to Modification 3. The longitudinal length La of the lower active part of the semiconductor device is larger than a thickness Lp of the p-type base layer 5. In other words, La>Lp holds. The Cge generated at the active trench A can be decreased by reducing the thickness Lp of the p-type base layer 5. In addition, the Cgc generated at the lower active part 14 can be increased by increasing the length La of the lower active part 14. Accordingly, the ratio Cgc/Cge can be further increased.

Modification 4

Figure 8:
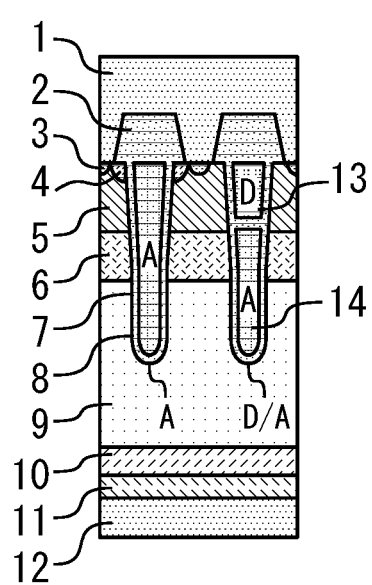
FIG. 8 is a cross-sectional view of a semiconductor device according to another example.
Figure 9:
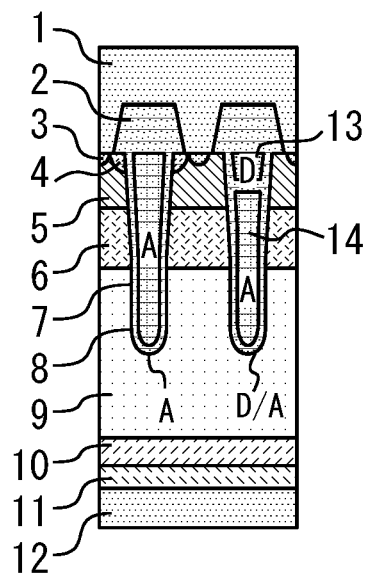
FIG. 9 is a cross-sectional view of a semiconductor device according to another example.

FIGS. 8 and 9 are cross-sectional views of a semiconductor device according to Modification 4. The upper end of the lower active part 14 is positioned within the base layer 5. In an example illustrated in FIG. 8, the upper end of the lower active part 14 and the lower end of the base layer 5 are positioned at the same height. In an example illustrated in FIG. 9, the upper end of the lower active part 14 is positioned higher than the lower end of the base layer 5.

When the upper end of the lower active part 14 is positioned lower than the lower end of the p-type base layer 5 as illustrated in FIG. 1, a region in which the lower active part 14 does not contact the $n^-$-type drift layer 9 nor the n-type carrier accumulation layer 6 is formed above the lower active part 14, and no Cgc is generated in the region. However, the Cgc can be increased by preventing, above the lower active part 14, formation of the region in which the lower active part 14 does not contact the n⁻-type drift layer 9 nor the n-type carrier accumulation layer 6, as illustrated in FIGS. 8 and 9.

Modification 5

Figure 10:
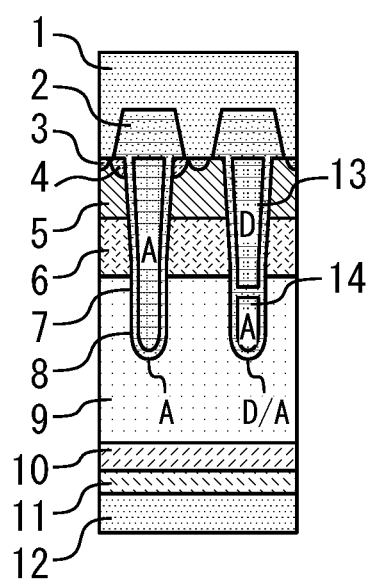
FIG. 10 is a cross-sectional view of a semiconductor device according to another example.

Although the upper end of the lower active part 14 is positioned lower than the lower end of the p-type base layer 5 in FIG. 1, the position of the upper end of the lower active part 14 may be further lowered. For example, the position of the upper end of the lower active part 14 may be lower than a concentration peak position of the n-type carrier accumulation layer 6. In another example, the upper end of the lower active part 14 may be positioned lower than the lower end of the n-type carrier accumulation layer 6 as illustrated in FIG. 10.

Gate potential oscillation is caused by displacement current flowing from the p-type base layer 5 to the lower active part 14 as holes injected from the back surface at turn-on change the potential of the p-type base layer 5, and accordingly, dV/dt controllability degrades. This phenomenon is significant in a case in which the p-type base layer 5 is floating or a case in which the distance between the lower active part 14 and the p-type base layer 5 is short, in particular. Thus, the lower active part 14 is separated from the p-type base layer 5 as described above, thereby reducing an adverse effect such as gate oscillation.

Differences from the first embodiment will be mainly described for a semiconductor device and a semiconductor apparatus according to each embodiment below.

Second Embodiment

Figure 11:
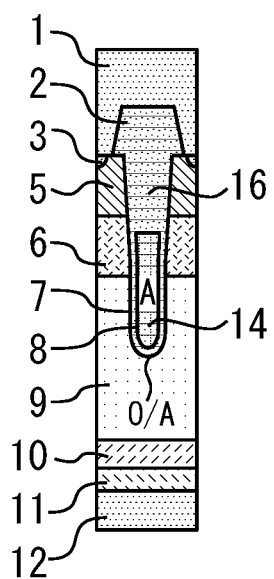
FIG. 11 is a cross-sectional view of the semiconductor device according to the second embodiment.

In a semiconductor device according to a second embodiment, the material of the upper dummy part of the two-part dummy active trench D/A is changed from polysilicon to another material. FIG. 11 is a cross-sectional view of the semiconductor device according to the second embodiment. The semiconductor device includes an oxide 16 as the upper dummy part. In an example, the oxide 16 may be made of a material same as that of the interlayer insulating film 2. A trench including the oxide 16 and the lower active part 14 is referred to as a two-part oxide active trench O/A.

Figure 12:
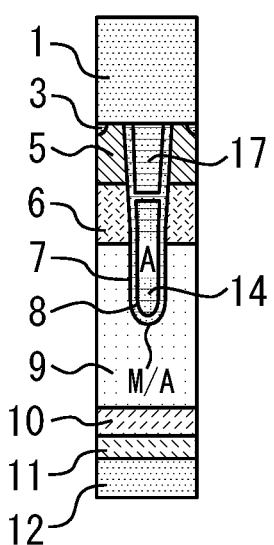
FIG. 12 is a cross-sectional view of a semiconductor device according to another example.

FIG. 12 is a cross-sectional view of a semiconductor device according to another example. In the example of FIG. 12, a metal 17 is included as the upper dummy part. The metal 17 may be made of a material same as that of the emitter electrode 1 and formed as part of the emitter electrode 1. A trench including the metal 17 and the lower active part 14 is referred to as a two-part metal active trench M/A.

Method of Manufacturing Two-Part Oxide Active Trench O/A

First, as in the first embodiment, the lower active part 14 is formed by etching polysilicon in the two-part active trench to a desired depth through mask processing. Subsequently, an interlayer insulating film is accumulated on the active trench A and the lower active part 14. Accordingly, the oxide 16 of the two-part oxide active trench O/A is formed.

Method of Manufacturing Two-Part Metal Active Trench M/A

Processes up to formation of the lower active part 14 are same as in the method of manufacturing the two-part oxide active trench O/A. When the two-part metal active trench M/A is to be formed, the amount of accumulation of the above-described interlayer insulating film is reduced and a metal is embedded on the interlayer insulating film to form the metal 17.

The following processes needed in the process of manufacturing the two-part dummy active trench D/A can be omitted in the process of manufacturing the two-part oxide active trench O/A or the two-part metal active trench M/A: the process of forming the gate insulating film 8 on the inner wall of the two-part dummy active trench D/A and the lower active part 14; and the process of forming the upper dummy part 13 through accumulation of polysilicon doped with n-type or p-type impurities through CVD or the like.

Modification 1

Figure 13:
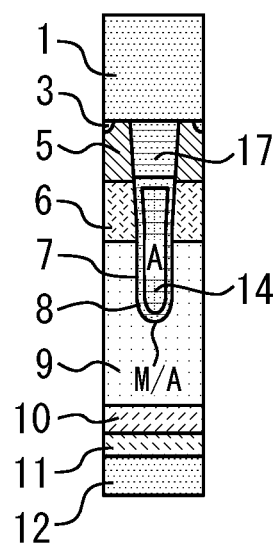
FIG. 13 is a cross-sectional view of a semiconductor device according to another example.

FIG. 13 is a cross-sectional view of a semiconductor device according to Modification 1. The metal 17 as the upper dummy part is in contact with the base layer 5. In other words, no gate insulating film exists between the metal 17 and the base layer 5. In another example, a gate insulating film between the upper dummy part 13 and the p-type base layer 5 in FIG. 1 may be deleted so that the upper dummy part 13 and the p-type base layer 5 are in contact with each other.

In this manner, the p-type base layer 5 may be electrically connected with the emitter electrode 1 through the upper dummy part 13 or the metal 17. Alternatively, the p-type base layer 5 may be in ohmic contact or Schottky contact with the upper dummy part 13 or the metal 17. Accordingly, holes are discharged from the p-type base layer 5 to the emitter electrode 1 through the upper dummy part 13 or the metal 17 at turn-off, and accordingly, the number of holes below the source layer 4, which cause latch-up breakdown, is reduced. As a result, latch-up breakdown strength improves.

Third Embodiment

The present embodiment describes decrease of the Cge as coupling capacitance generated between the active trench A and the upper dummy part 13 adjacent to each other. First, the active trench A and the upper dummy part 13 will be briefly described. The inventor has found that, in a trench configuration in which the active trench A and the upper dummy part 13 of the two-part dummy active trench D/A are adjacent to each other as illustrated in FIG. 1, the Cge as coupling capacitance is generated between the active trench A and the upper dummy part 13 since the active trench A at gate potential is positioned adjacent to the upper dummy part 13 at emitter potential. Note that this phenomenon has small influence in a region in which the upper dummy part 13 faces the p-type base layer 5 electrically connected with the emitter electrode 1, but has large influence when the upper dummy part 13 faces the n⁻-type drift layer 9 and the n-type carrier accumulation layer 6, in particular. A semiconductor device according to a third embodiment is manufactured based on this knowledge.

Figure 14:
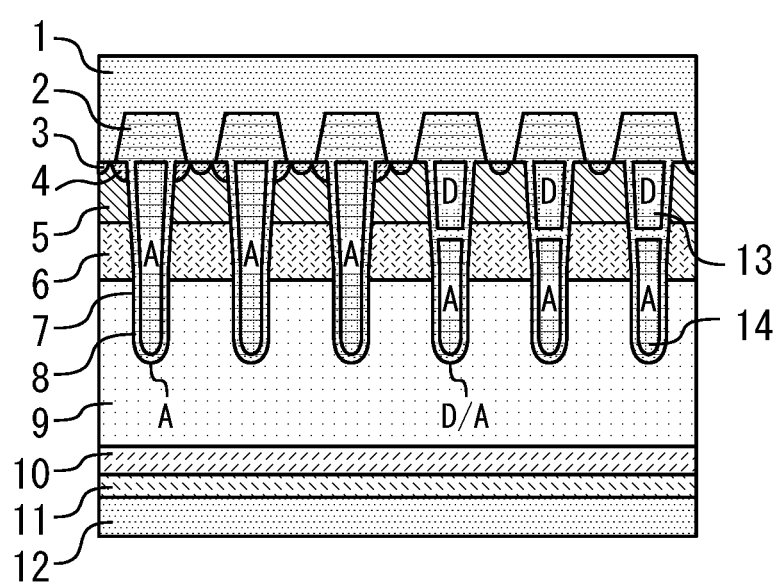
FIG. 14 is a cross-sectional view of the semiconductor device according to the third embodiment.

FIG. 14 is a cross-sectional view of the semiconductor device according to the third embodiment. In this example, a first structure in which two or more active trenches A are arranged and a second structure in which two or more two-part dummy active trenches D/A are arranged are alternately provided. Since the active trench A are collectively arranged and the two-part dummy active trench D/A are collectively arranged, the density of an active trench A and a two-part dummy active trench D/A adjacent to each other is low as compared to a case in which one active trench A and one two-part dummy active trench D/A are alternately provided.

Accordingly, the coupling capacitance Cge between an active trench A and a two-part dummy active trench D/A is decreased while the Cgc is maintained. In a more preferable example, a first structure in which three or more active trenches A are arranged and a second structure in which three or more two-part dummy active trenches D/A are arranged may be alternately provided. Accordingly, active trenches A adjacent to no two-part dummy active trench D/A are formed, and thus the Cge is decreased, in particular.

Figure 15:
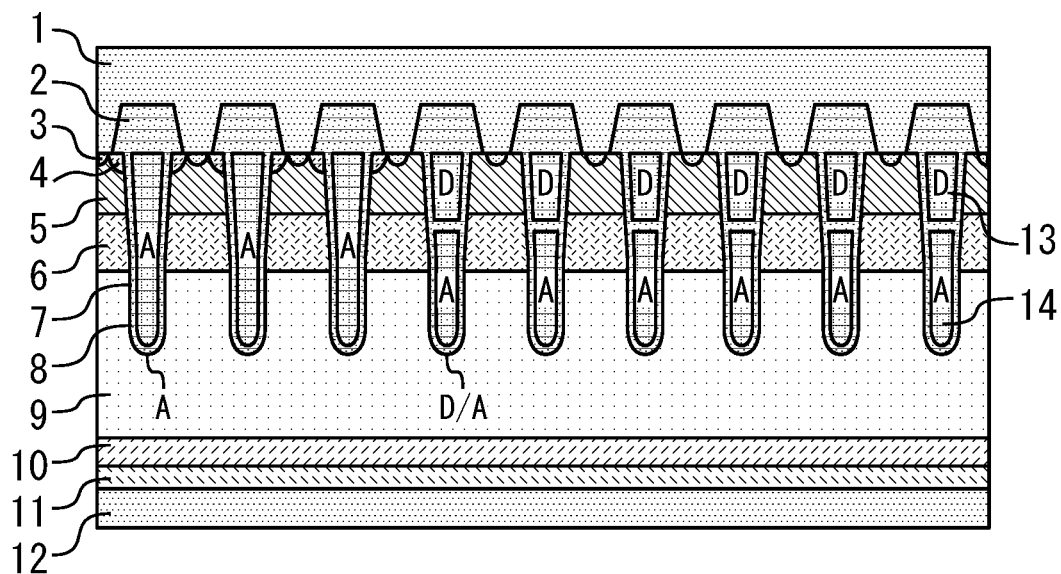
FIG. 15 is a cross-sectional view of a semiconductor device according to another example.

FIG. 15 is a cross-sectional view of a semiconductor device according to another example. In this example, the number of two-part dummy active trenches D/A is larger than the number of active trenches A. As the number of two-part dummy active trenches D/A increases, the rate of Cge generation increases and a Cge decrease effect due to the above-described collective arrangement becomes larger.

Modification 1

Figure 16:
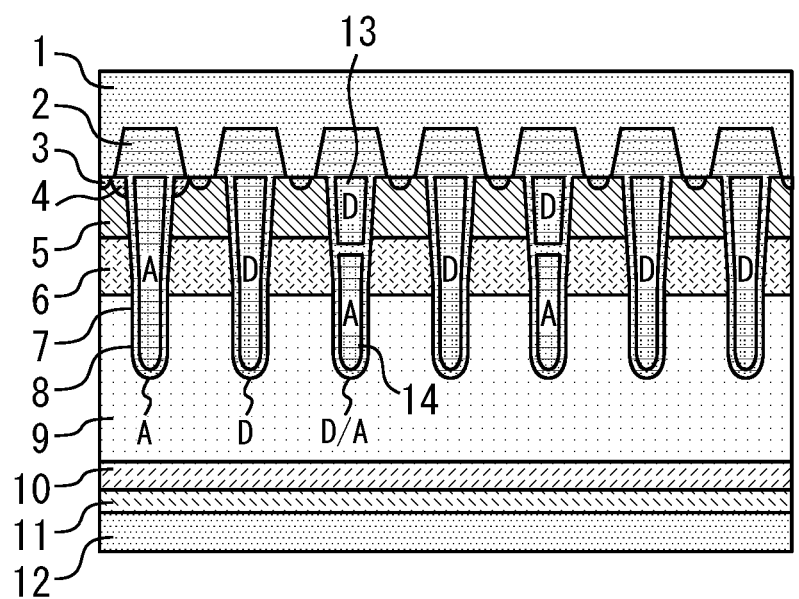
FIG. 16 is a cross-sectional view of a semiconductor device according to another example.

FIG. 16 is a cross-sectional view of a semiconductor device according to Modification 1. The semiconductor device includes a dummy trench D. The dummy trench D is electrically connected with the emitter electrode 1. Gate capacitance can be adjusted by changing the ratio of the dummy trench D relative to the entire trench. However, the Cge as coupling capacitance is generated between the dummy trench D and the lower active part 14.

Modification 2

Figure 17:
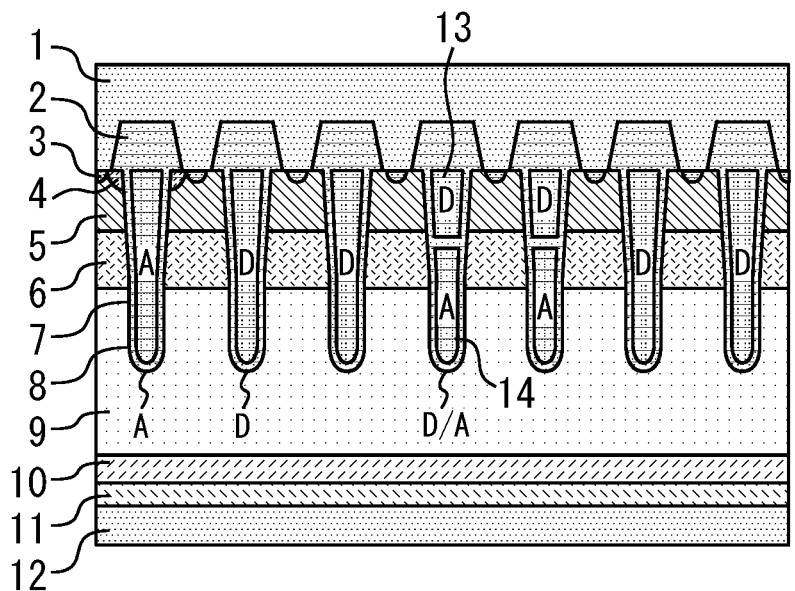
FIG. 17 is a cross-sectional view of a semiconductor device according to another example.

FIG. 17 is a cross-sectional view of a semiconductor device according to Modification 2. The semiconductor device includes a first structure in which one or more active trenches are arranged, a second structure in which two or more two-part dummy active trenches D/A are arranged, and a third structure in which one or more dummy trenches are arranged. The second structure is sandwiched between the two third structures.

When the two-part dummy active trenches D/A are collectively arranged in this manner, the Cge generated between the lower active part 14 and the dummy trench D can be decreased. Accordingly, the ratio Cgc/Cge can be increased. However, the Cge as coupling capacitance is generated between the dummy trench D and the lower active part 14.

Modification 3

Figure 18:
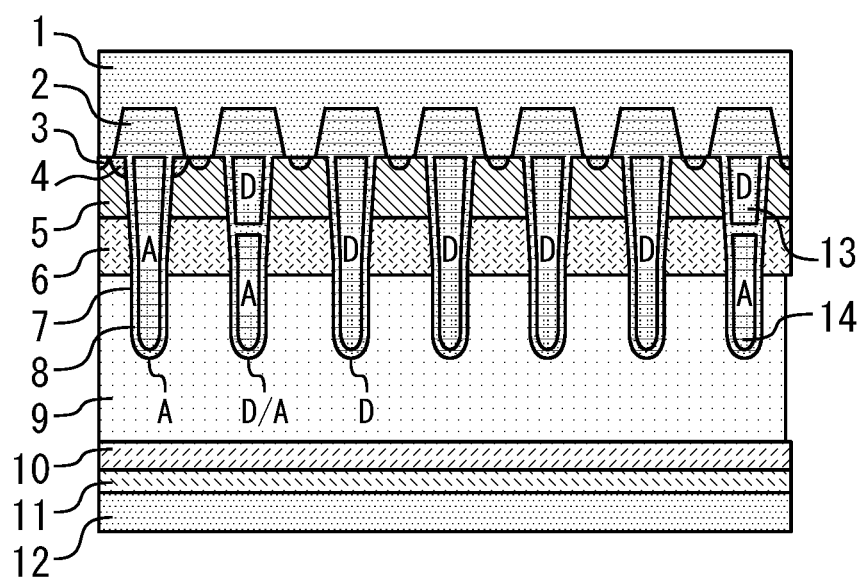
FIG. 18 is a cross-sectional view of a semiconductor device according to another example.

FIG. 18 is a cross-sectional view of a semiconductor device according to Modification 3. The semiconductor device includes a first structure in which one or more active trenches A are arranged, a second structure in which one or more two-part dummy active trenches D/A are arranged, and a third structure in which one or more dummy trenches are arranged. The second structure is sandwiched between the first structure and the third structure.

Since the active trenches A and the two-part dummy active trenches D/A are collectively arranged and the dummy trenches D are collectively arranged, the Cge generated between each lower active part 14 and the corresponding dummy trench D and the Cge generated between each active trench A and the corresponding dummy trench D are decreased. Accordingly, the ratio Cgc/Cge can be further increased.

Modification 4

Figure 19:
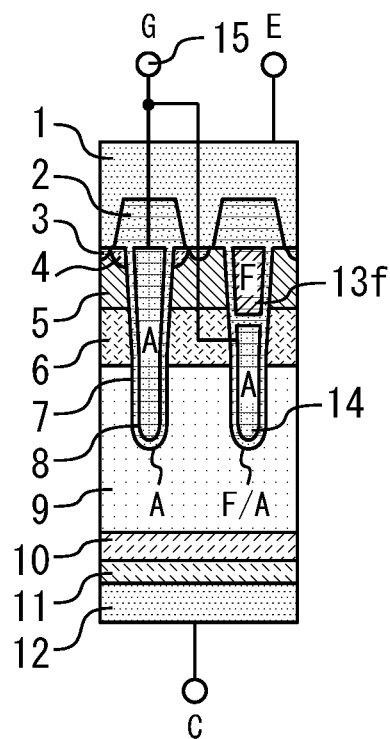
FIG. 19 is a cross-sectional view of a semiconductor device according to another example.

FIG. 19 is a cross-sectional view of a semiconductor device according to Modification 4. An upper dummy part 13f is not connected with the emitter electrode 1 and has floating potential. A trench including the upper dummy part 13 and the lower active part 14 is referred to as a two-part floating active trench F/A.

Since the upper dummy part 13f at floating potential is provided, the Cge generated between the active trench A and the upper dummy part 13 of the two-part dummy active trench D/A is decreased. Accordingly, the ratio Cgc/Cge can be further increased.

Modification 5

Figure 20:
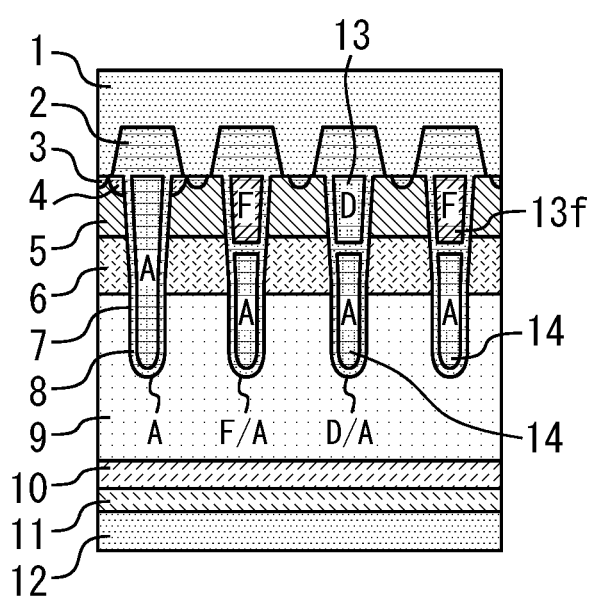
FIG. 20 is a cross-sectional view of a semiconductor device according to another example.

FIG. 20 is a cross-sectional view of a semiconductor device according to Modification 5. The semiconductor device includes, as two-part dummy active trenches, a first trench in which the upper dummy part 13 is connected with the emitter electrode 1 and a second trench in which the upper dummy part 13f has floating potential. In FIG. 20, the two-part dummy active trench D/A is the first trench, and the two-part floating active trench F/A is the second trench. The second trench is sandwiched between the first trench and the active trench A.

Figure 21:
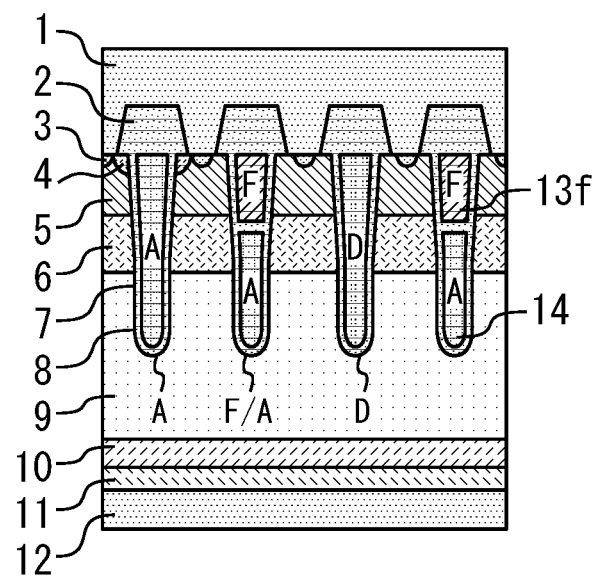
FIG. 21 is a cross-sectional view of a semiconductor device according to another example.

FIG. 21 illustrates a semiconductor device in which the two-part dummy active trench D/A in FIG. 20 is replaced with the dummy trench D. In this case, the two-part floating active trench F/A is sandwiched between the dummy trench D and the active trench A.

With the configuration of FIG. 20, the Cge generated between the active trench A and the upper dummy part 13 of the two-part dummy active trench D/A can be decreased. With the configuration of FIG. 21, the Cge generated between the active trench A and the dummy trench D can be decreased. Accordingly, the ratio Cgc/Cge can be further increased with any of the configurations.

Modification 6

Figure 22:
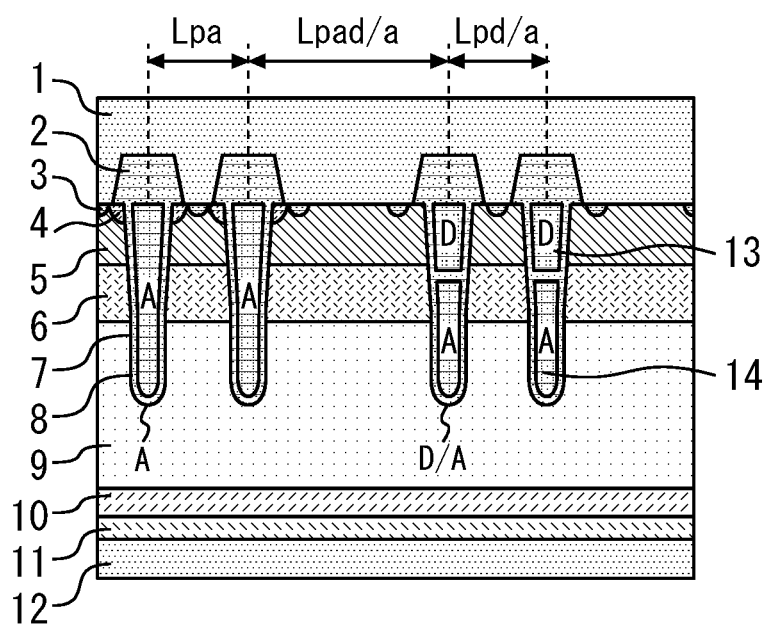
FIG. 22 is a cross-sectional view of a semiconductor device according to another example.

FIG. 22 is a cross-sectional view of a semiconductor device according to Modification 6. In the semiconductor device, the distance between a first structure in which two or more two-part dummy active trenches D/A are arranged and a second structure in which two or more active trenches A are arranged is longer than the distance between two two-part dummy active trenches D/A and longer than the distance between two active trenches A. FIG. 22 illustrates that an interval Lpad/a between an active trench A and a two-part dummy active trench D/A is larger than an interval Lpa between the active trench A and another active trench A and larger than an interval Lpd/a between the two-part dummy active trench D/A and another two-part dummy active trench D/A. In other words, Lpad/a>Lpa and Lpad/a>Lpd/a hold.

As the distance between the active trench A and the two-part dummy active trench D/A is longer in this manner, the Cge as coupling capacitance generated between the active trench A and the upper dummy part 13 of the two-part dummy active trench D/A decreases. Accordingly, the ratio Cgc/Cge can be further increased.

Modification 7

Figure 23:
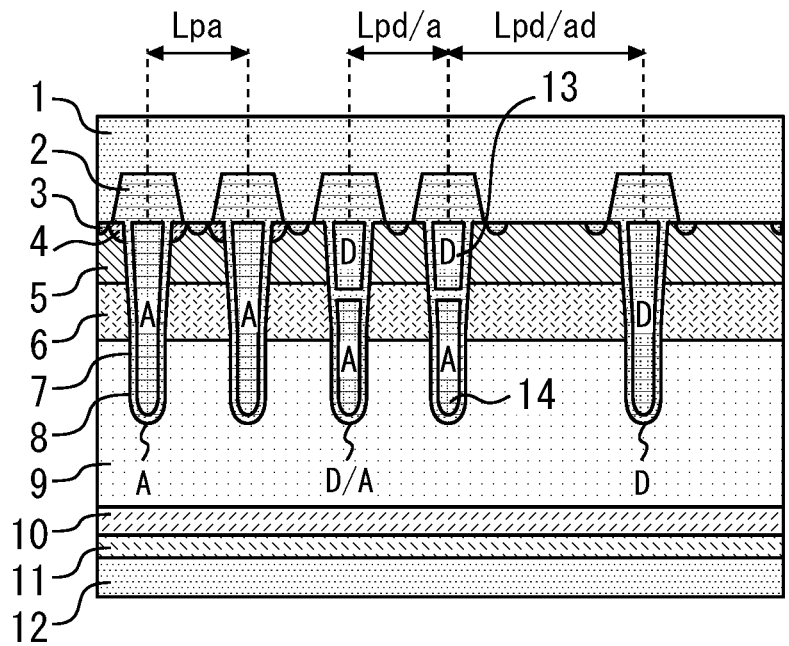
FIG. 23 is a cross-sectional view of a semiconductor device according to another example.

FIG. 23 is a cross-sectional view of a semiconductor device according to Modification 7. The semiconductor device includes a first structure in which two or more active trenches A are arranged, a second structure that is adjacent to the first structure and in which two or more two-part dummy active trenches D/A are arranged, and a dummy trench D adjacent to the second structure. The distance between the second structure and the dummy trench D is longer than the distance between two active trenches A, the distance between the first structure and the second structure, or the distance between two two-part dummy active trenches D/A.

FIG. 23 illustrates that an interval Lpd/ad between a two-part dummy active trench D/A and a dummy trench D is larger than the interval Lpa between an active trench A and another active trench A, and the interval Lpd/a between the two-part dummy active trench D/A and another two-part dummy active trench D/A. In other words, Lpd/ad>Lpa and Lpd/ad>Lpd/a hold.

As the distance between the two-part dummy active trench D/A and the dummy trench D is longer in this manner, the Cge as coupling capacitance generated between the lower active part 14 of the two-part dummy active trench D/A and the dummy trench D decreases. Accordingly, the ratio Cgc/Cge can be further increased.

Fourth Embodiment

Figure 24A:
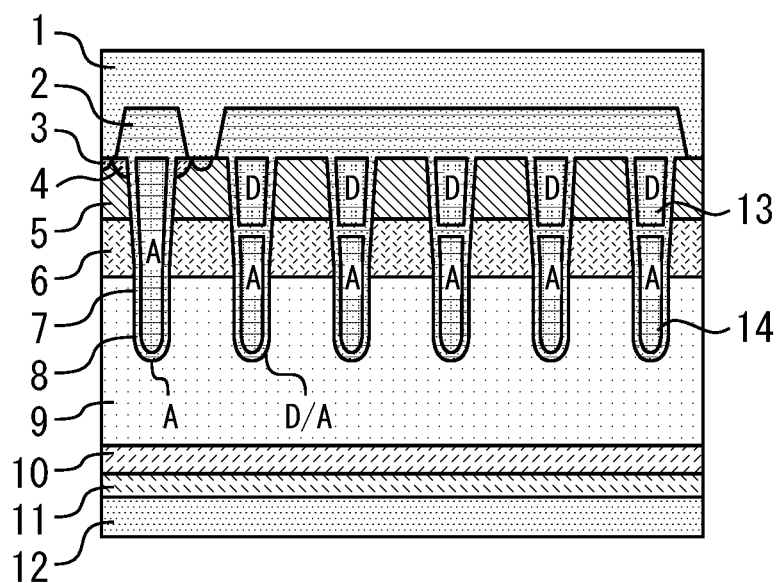
FIG. 24A is a cross-sectional view of a semiconductor device according to a fourth embodiment.

FIG. 24A is a cross-sectional view of a semiconductor device according to a fourth embodiment. Two or more two-part dummy active trenches D/A are provided adjacent to each other. Part of the base layer 5, which is adjacent to the active trench A is connected with the emitter electrode 1. Other part of the base layer 5, which is sandwiched between two two-part dummy active trenches D/A is not connected with the emitter electrode 1. The part of the base layer 5, which is sandwiched between two two-part dummy active trenches D/A may have floating potential or may be electrically connected with the emitter electrode 1 through a resistor of high resistance at another section.

At least one of the two-part dummy active trenches D/A in FIG. 24A may be replaced with a dummy trench D. In this case, part of the base layer 5, which is sandwiched between two dummy trenches D or part of the base layer 5, which is sandwiched between a dummy trench D and a two-part dummy active trench D/A is not connected with the emitter electrode 1, and may have floating potential or may be electrically connected with the emitter electrode 1 through a resistor of high resistance at another section.

Figure 25:
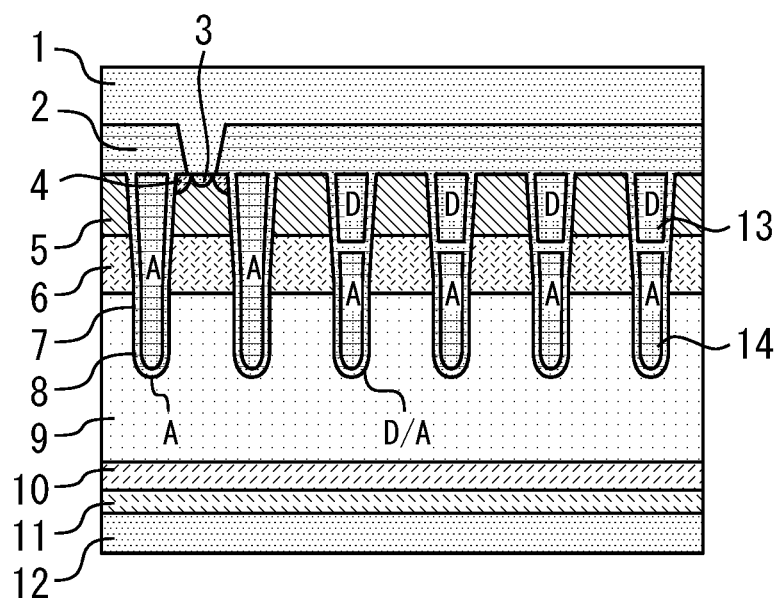
FIG. 25 is a cross-sectional view of a semiconductor device according to another example.

FIG. 25 is a cross-sectional view of a semiconductor device according to another example. Part of the base layer 5, which is adjacent to two active trenches A is connected with the emitter electrode 1. Other part of the base layer 5, which is adjacent to a two-part dummy active trench D/A is not connected with the emitter electrode 1. Accordingly, in the base layer 5, a part sandwiched between two-part dummy active trenches D/A and a part adjacent to both an active trench A and a two-part dummy active trench D/A are not connected with the emitter electrode 1. Part of the base layer 5, which is not connected with the emitter electrode 1 may have floating potential or may be electrically connected with the emitter electrode 1 through a resistor of high resistance at another section.

With these configurations, a fraction of the p-type base layer 5 connected with the emitter electrode 1 to which holes are discharged can be reduced. When holes become unlikely to be discharged to the emitter electrode 1, the number of holes accumulated in the drift layer 9 increases, and on-voltage at which conductivity modulation is promoted is lowered. In addition, displacement current from the p-type base layer 5 in a floating state flows into the upper dummy part 13 not connected the gate electrode 15 and is discharged to the emitter electrode 1. Accordingly, gate potential oscillation, which is a typically concerned matter, when displacement current flows from the p-type base layer 5 in the floating state to the gate electrode through an active trench can be reduced.

Modification 1

Figure 24B:
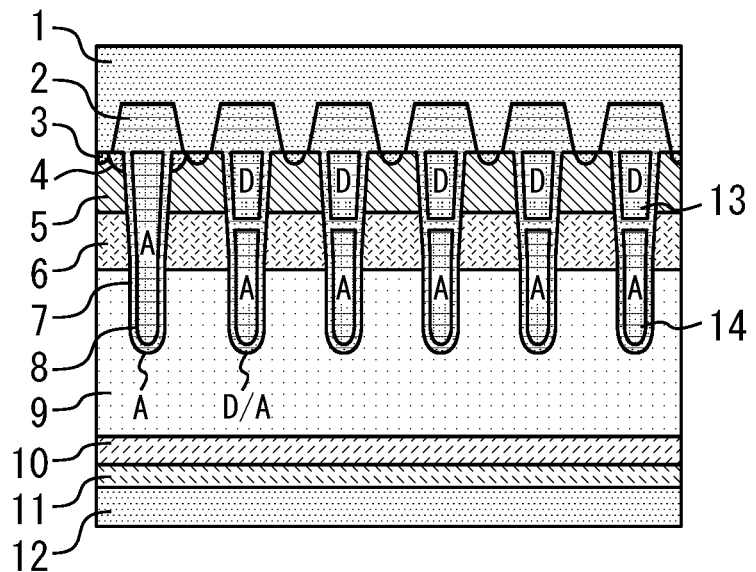
FIG. 24B is a cross-sectional view of a semiconductor device according to another example.

FIG. 24B is a cross-sectional view of a semiconductor device according to Modification 1. Part of the base layer 5, which is sandwiched between two two-part dummy active trenches D/A is connected with the emitter electrode 1.

Modification 2

Figure 24C:
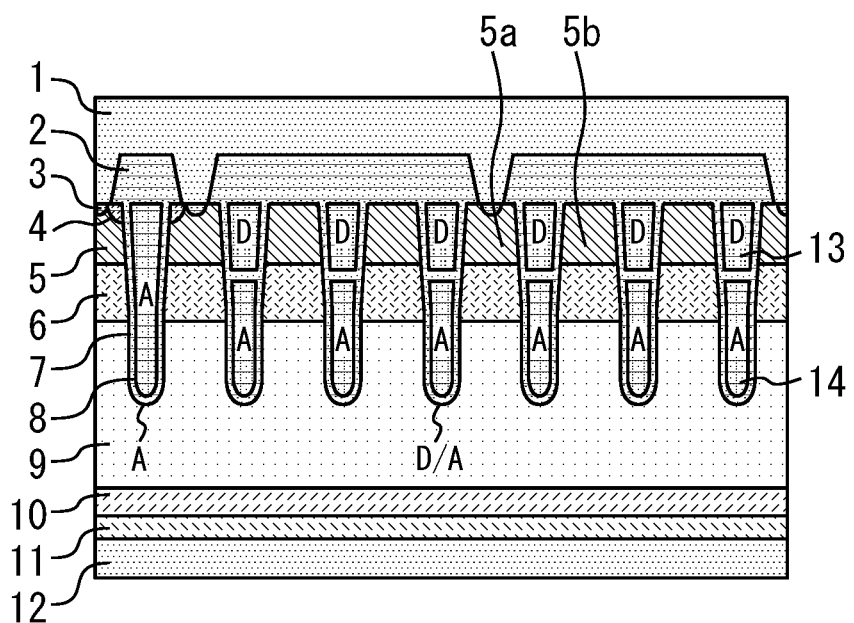
FIG. 24C is a cross-sectional view of a semiconductor device according to another example.

FIG. 24C is a cross-sectional view of a semiconductor device according to Modification 2. The base layer 5 is divided into a plurality of base parts because a plurality of two-part dummy active trenches D/A are provided. The plurality of base parts include a base part 5a connected with the emitter electrode 1 and a base part 5b not connected with the emitter electrode 1.

Modification 3

Figure 24D:
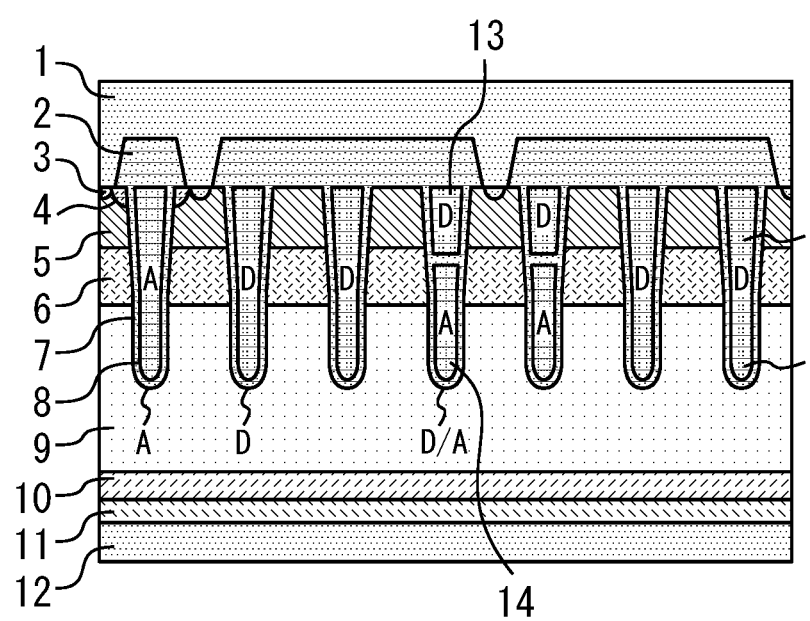
FIG. 24D is a cross-sectional view of a semiconductor device according to another example.

FIG. 24D is a cross-sectional view of a semiconductor device according to Modification 3. The semiconductor device includes at least two dummy trenches D. Part of the base layer 5, which is sandwiched between two dummy trenches D is not connected with the emitter electrode 1, and part of the base layer 5, which is sandwiched between two two-part dummy active trenches D/A is connected with the emitter electrode 1.

In Modifications 1 and 3, at least part of the base layer 5 sandwiched between two two-part dummy active trenches D/A is connected the emitter electrode 1. At turn-off, an inversion layer is formed around the lower active part 14 of each two-part dummy active trench D/A and functions as a hole discharge path. When the p-type base layer 5 sandwiched between two-part dummy active trenches D/A is connected with the emitter electrode 1, holes flowing along the lower active part 14 can be discharged to reduce a turn-off loss. When the p-type base layer 5 is partially in the floating state, carriers can be accumulated to lower the on-voltage, and carriers can be discharged through the p-type base layer 5 being grounded, thereby reducing the turn-off loss. In addition, an effect of the hole discharge path is high at a place where a two-part dummy active trench D/A is provided, and thus the on-voltage can be lowered when the p-type base layer 5 between dummy trenches D is in the floating state to accumulate carriers, and the turn-off loss can be reduced when the p-type base layer 5 between two-part dummy active trenches D/A is grounded.

Fifth Embodiment

Figure 26:
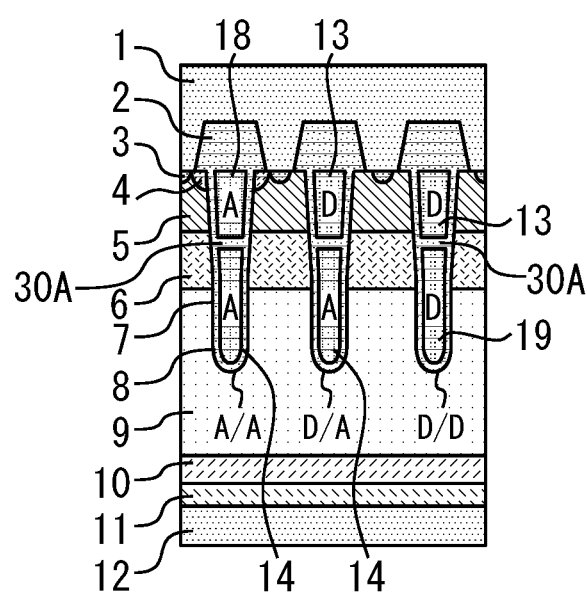
FIG. 26 is a cross-sectional view of a semiconductor device according to a fifth embodiment.

FIG. 26 is a cross-sectional view of a semiconductor device according to a fifth embodiment. The semiconductor device includes a two-part active trench A/A and a two-part dummy trench D/D. In the two-part active trench A/A, an active part is divided into two parts of upper and lower parts through a middle insulating film 30A. In the two-part dummy trench D/D, a dummy trench is divided into two parts of upper and lower parts through the middle insulating film 30A. Similarly to an insulating film that separates the upper dummy part 13 and the lower active part 14 of a two-part dummy active trench D/A, the middle insulating film 30A is, for example, an oxide film.

Figure 27:
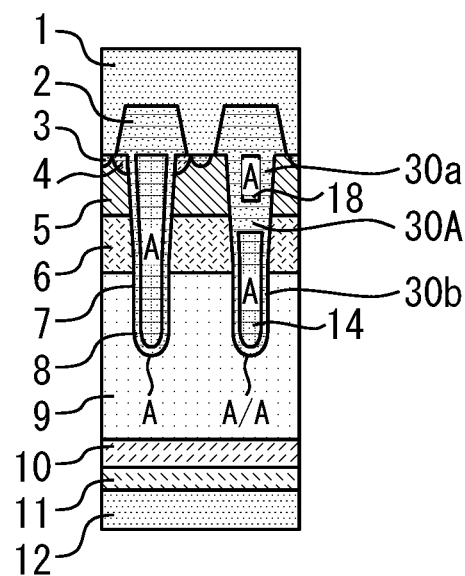
FIG. 27 is a cross-sectional view of a semiconductor device according to another example.

FIG. 27 is a cross-sectional view of a semiconductor device according to another example. Part of the active part of a two-part active trench A/A on the upper side of the middle insulating film 30A is covered by a first insulating film 30a, and part of the active part on the lower side of the middle insulating film 30A is covered by a second insulating film 30b. The first insulating film 30a is thicker than the second insulating film 30b.

When the first insulating film 30a is thicker than the second insulating film 30b, the Cge generated at an upper active part 18 of the two-part active trench A/A is smaller and the Cgc is generated at the lower active part 14. Accordingly, the ratio Cgc/Cge can be further increased.

Modification 1

Figure 28:
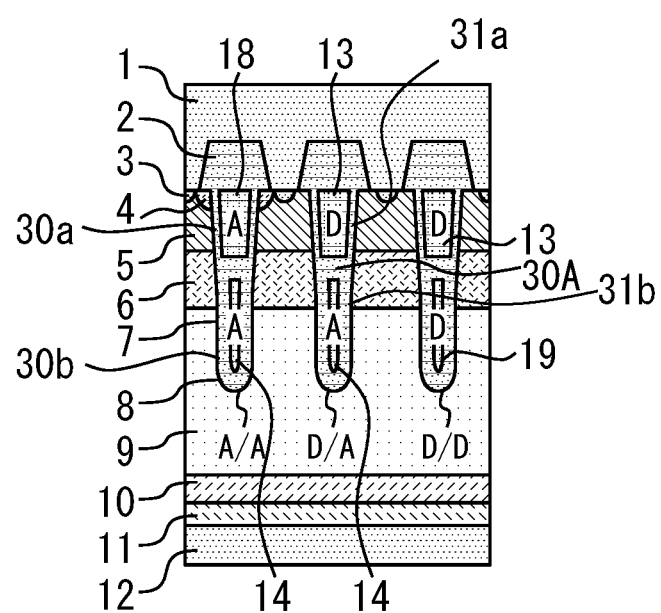
FIG. 28 is a cross-sectional view of a semiconductor device according to another example.

FIG. 28 is a cross-sectional view of a semiconductor device according to Modification 1. The semiconductor device includes the first insulating film 30a covering the part of the active part on the upper side of the middle insulating film 30A, and the second insulating film 30b covering the part of the active part on the lower side of the middle insulating film 30A. Sidewall and bottom parts of the second insulating film 30b are thicker than the first insulating film 30a. The semiconductor device also includes a third insulating film 31a covering the upper dummy part 13. Sidewall and bottom parts of the insulating film covering the lower active part 14 are thicker than the third insulating film 31a.

In this manner, in each two-part active trench A/A and each two-part dummy active trench D/A, the gate insulating film 8 formed on the sidewall and bottom part of the trench 7 at the lower active part 14 is thicker than a gate oxide film covering the upper active part 18 or the upper dummy part 13.

In another example, the thickness of the gate insulating film 8 on the sidewall of the trench 7 at the lower active part 14 may be equal to or slightly smaller than the thickness of the gate insulating film 8 at the upper active part 18 to increase the Cgc, and the thickness of the gate insulating film 8 on the bottom part and a bottom corner part of the trench 7 at the lower active part 14 may be smaller than the thickness of the gate insulating film 8 at the upper active part 18 to reduce degradation of gate characteristics in electric field concentration at the trench bottom part.

When the thickness of the gate insulating film 8 formed on the trench sidewall and bottom part of the lower active part 14 of the two-part active trench A/A is large, it is possible to reduce degradation of gate characteristics due to hot carrier injection into the lower active part 14, which is caused by dynamic avalanche generated due to electric field concentration at the trench bottom part at turn-off Modification 2

Figure 29:
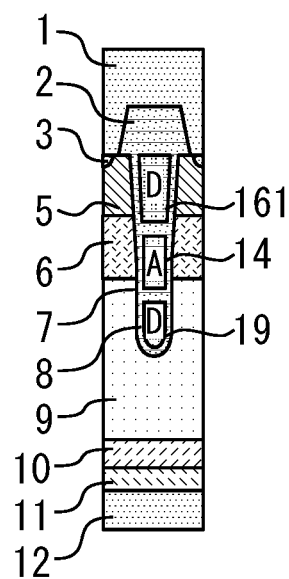
FIG. 29 is a cross-sectional view of a semiconductor device according to another example.

FIG. 29 is a cross-sectional view of a semiconductor device according to Modification 2. The semiconductor device includes a three-part trench. The three-part trench is a trench of the semiconductor substrate in which a first dummy part 161 connected with the emitter electrode is provided at an upper part, an active part 14 connected with the gate electrode is provided at a middle part, and a second dummy part 19 connected with the emitter electrode is provided at a lower part. The first dummy part 161, the active part 14, and the second dummy part 19 are insulated from one another through, for example, polysilicon inside the trench 7.

Since the lower part of the three-part trench is the second dummy part 19 at dummy potential, hot carriers due to dynamic avalanche are injected into not the active part 14 but the second dummy part 19 not electrically connected with the gate electrode 15. Accordingly, degradation of gate characteristics can be reduced. Since the active part 14 is provided, effects same as those of the first embodiment can be achieved.

Six Embodiment

Double-gate drive is disclosed as a method to lower on-resistance and reduce a switching loss. The double-gate drive is a technology that two gate drive systems are provided and drive timings of two gates are changed to reduce the switching time of an IGBT and reduce the switching loss. Specifically, before turn-off, the gate of one system is turned off to close a channel, thereby reducing the number of carriers in a drift layer before cutoff Thus, it is possible to lower the on-resistance and reduce the switching loss. In the present embodiment, a semiconductor device of the double-gate drive is disclosed.

Figure 30:
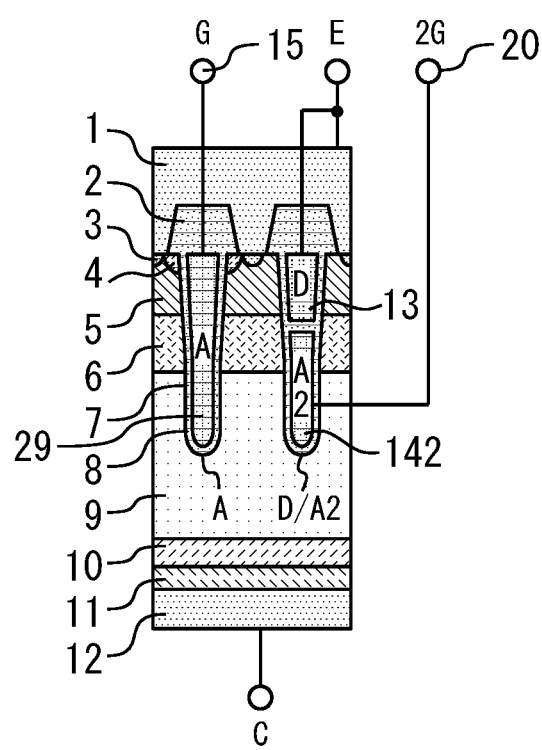
FIG. 30 is a cross-sectional view of a semiconductor device according to a sixth embodiment.

FIG. 30 is a cross-sectional view of a semiconductor device according to a sixth embodiment. The gate electrode includes a first gate electrode 15, and a second gate electrode 20 of a system different from that of the first gate electrode 15. The active part 29 is connected with the first gate electrode 15, and a lower active part 142 is connected with the second gate electrode 20.

Figure 33:
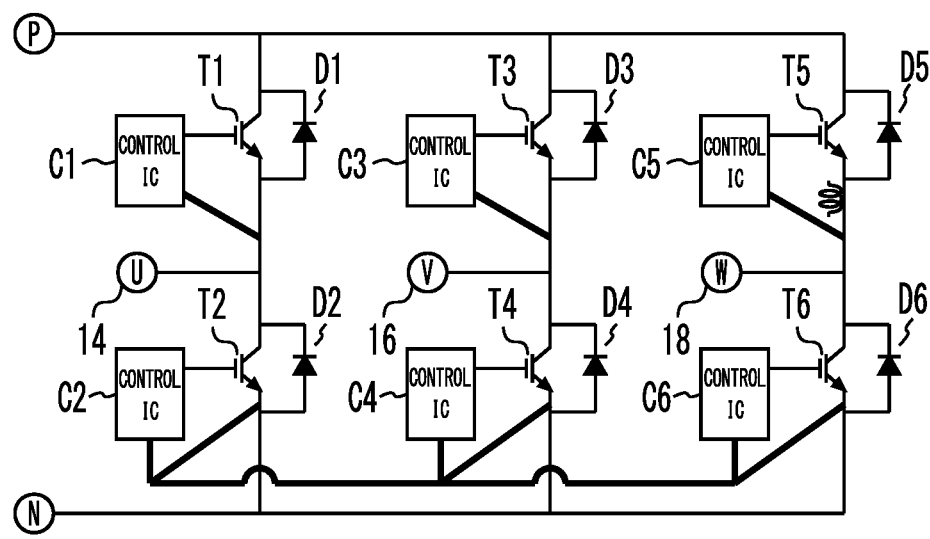
FIG. 33 is a diagram illustrating an application example of a semiconductor device.

FIG. 33 is a diagram illustrating an exemplary configuration of a three-phase inverter circuit. The inverter circuit includes p-side semiconductor devices T1, T3, and T5 and n-side semiconductor devices T2, T4, and T6. In an example, the semiconductor device in FIG. 30 may be provided as any one of the p-side semiconductor devices T1, T3, and T5 and the n-side semiconductor devices T2, T4, and T6.

In an example, when the semiconductor device is to be switched from the on-state to the off-state, voltage (off) equal to or lower than a threshold value voltage is applied the second gate electrode 20, and then voltage equal to or lower than the threshold value voltage is applied to the first gate electrode 15. Accordingly, the Cgc can be reduced by the Cgc of the lower active part 142 before turn-off, and thus the Cgc at turn-off when voltage equal to or lower than the threshold value voltage is applied the gate electrode 15 is only the Cgc parasitic to the active trench A. This shortens the switching time, thereby reducing the turn-off loss.

Note that, at turn-on, when voltage equal to or higher than the threshold value voltage is applied (on) to the first gate electrode 15 and the second gate electrode 20 at the same timing, switching can be performed without decreasing the Cgc at turn-on, and thus purposes and effects same as those described in the first embodiment can be achieved.

Modification 1

Figure 31:
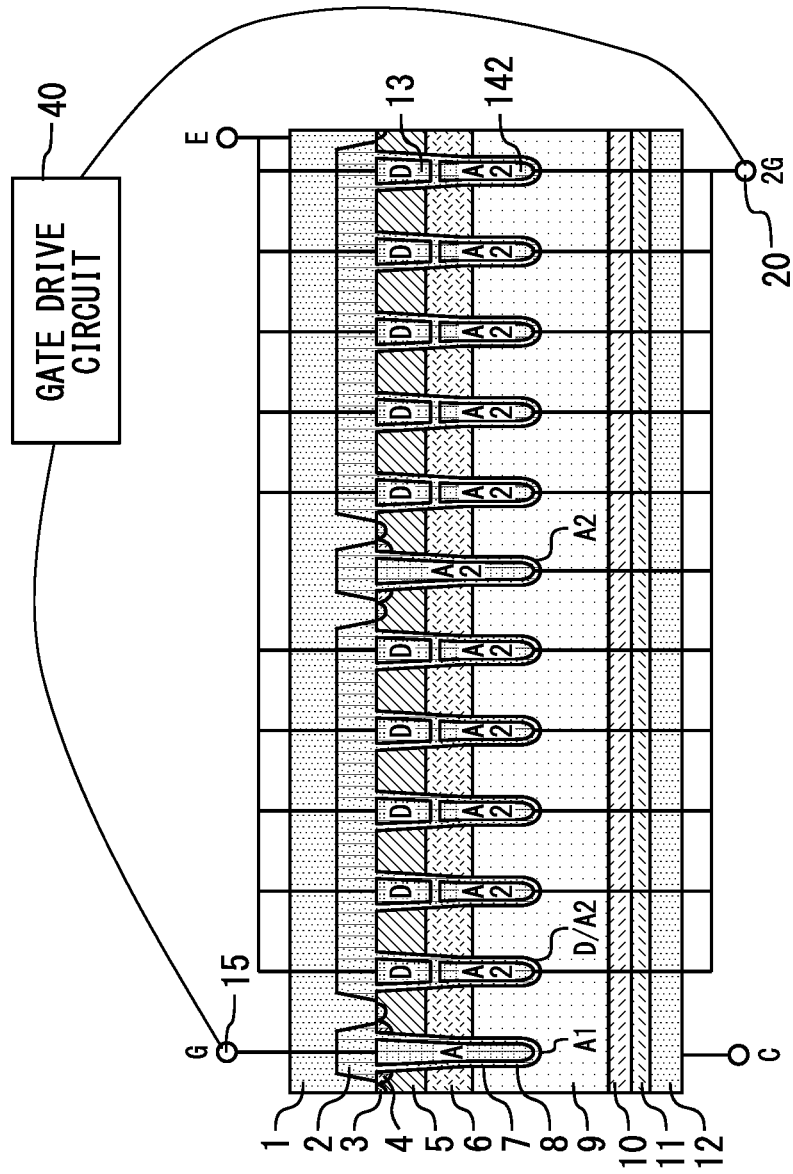
FIG. 31 is a cross-sectional view of a semiconductor device according to another example.

FIG. 31 is a cross-sectional view of a semiconductor device according to Modification 1. The gate electrode includes the first gate electrode 15, and the second gate electrode 20 of a system different from that of the first gate electrode 15. The active trench A includes a first active trench A1 and a second active trench A2. An active part of the first active trench A1 is connected with the first gate electrode 15, and an active part of the second active trench A2 and the lower active part 142 are connected with the second gate electrode 20.

Figure 32:
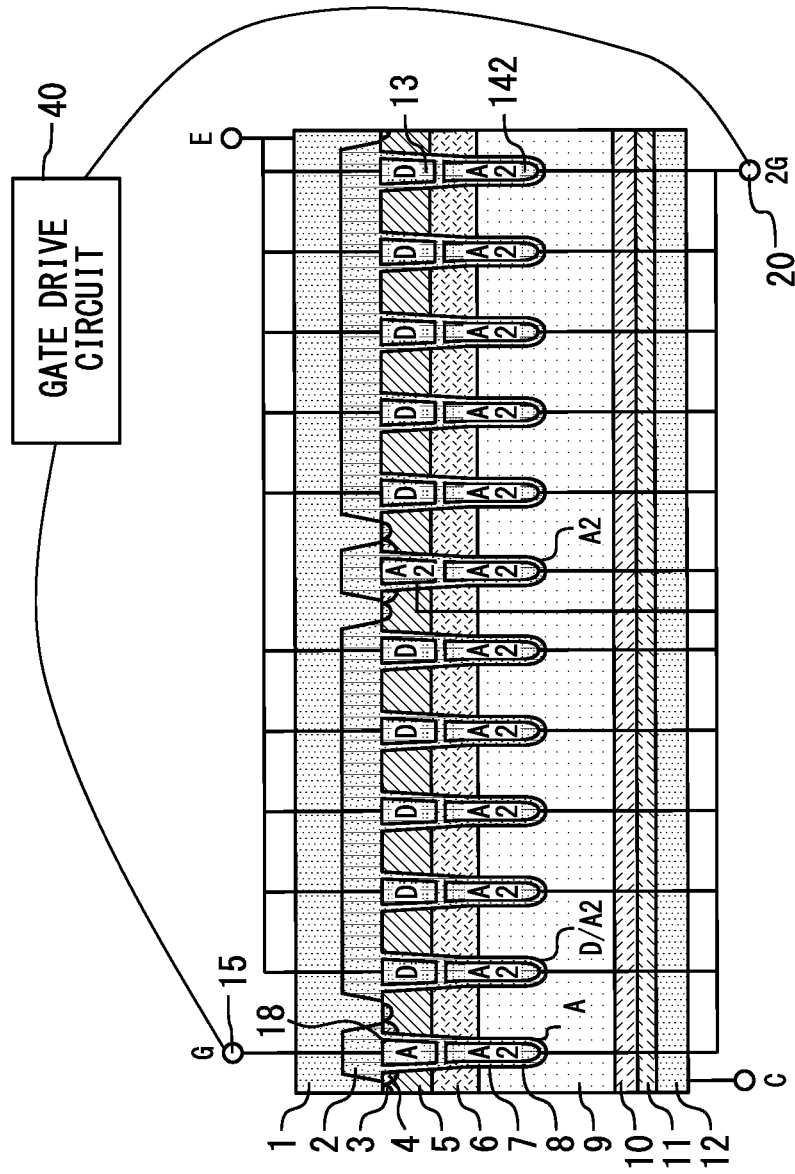
FIG. 32 is a cross-sectional view of a semiconductor device according to another example.

FIG. 32 is a cross-sectional view of a semiconductor device according to another example. Part of the active part of the active trench A on the upper side of a middle insulating film is connected with the first gate electrode 15, and part of the active part on the lower side of the middle insulating film is connected with the second gate electrode 20. Parts of the active part of the active trench A2 on the upper and lower sides of the middle insulating film are connected with the second gate electrode 20. With the configuration in FIG. 32, the function of a channel formation part at the upper part of an active part and the function of a Cgc part at the active part 14 at the lower part can be separated and switched at optimum timings, respectively.

The Cgc of the lower active part 142 can be decreased by turning off the second gate electrode 20 before turn-off of the semiconductor device. In addition, since part of the active trench A is connected with the second gate electrode 20, the active trench A2 or the lower active part 142 connected with the second gate electrode can be closed before turn-off of a channel of an active part connected with the first gate electrode. Accordingly, the number of carriers in the drift layer 9 can be reduced, and the turn-off loss can be reduced.

Modification 2

Although operation of the second gate electrode 20 at turn-on is not particularly limited in the sixth embodiment, voltage equal to or higher than the threshold value voltage may be applied (on) to the second gate electrode 20 only at turn-on with low current. In an example, the second gate electrode 20 may be turned on at turn-on only when the current value is equal to or smaller than 20% of rated current.

Figure 34:
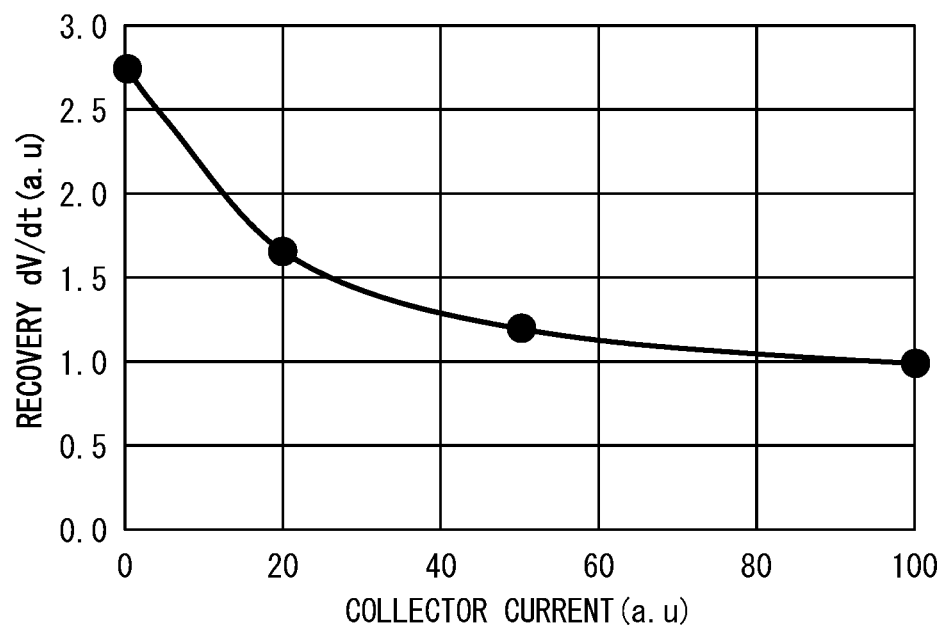
FIG. 34 is a diagram illustrating a relationship between collector current and recovery dV/dt.

FIG. 33 illustrates first semiconductor devices T1, T3, and T5, the collectors of which are connected with the high-potential side of a power source, and second semiconductor devices T2, T4, and T6, the emitters of which are connected with the low-potential side of the power source and the collectors of which are connected with the emitters of the first semiconductor devices T1, T3, and T5. The semiconductor device illustrated in any of FIGS. 30 to 32 may be employed as the second semiconductor devices T2, T4, and T6. In an example, any one of the second semiconductor devices T2, T4, and T6 is controlled by a gate drive circuit 40 illustrated in FIGS. 31 and 32. The gate drive circuit 40 applies gate voltage to the first gate electrode 15 and the second gate electrode 20 through respective systems. Then, when the collector current of a first semiconductor device is larger than a predetermined value, the gate drive circuit applies voltage equal to or higher than a threshold value to the first gate electrode 15 but does not apply voltage equal to or higher than the threshold value to the second gate electrode 20. When the collector current of the first semiconductor device is smaller than the predetermined value, the gate drive circuit applies voltage equal to or higher than the threshold value to the first gate electrode 15 and the second gate electrode 20. The "predetermined value" of the collector current is a value at low current, and the recovery dV/dt of a diode at low current is larger than the recovery dV/dt at rated current. This is illustrated in, for example, FIG. 34. The Cgc needs to be increased to reduce the recovery dV/dt at low current, and thus voltage equal to or higher than the threshold value is applied to the first gate electrode 15 and the second gate electrode 20. At rated current, the Cgc does not need to be increased because the recovery dV/dt is small, and thus voltage equal to or higher than the threshold value is applied to the first gate electrode 15 but voltage equal to or higher than the threshold value is not applied to the second gate electrode 20.

With this control, at turn-on with low current, the second gate electrode 20 is turned on, and thus the Cgc can be increased to lower dV/dt at low current. At rated current, the second gate electrode 20 is not turned on, and thus the Cgc is decreased to shorten the switching time, thereby increasing dV/dt. As a result, current dependency of dV/dt can be reduced.

Seventh Embodiment

Figure 35:
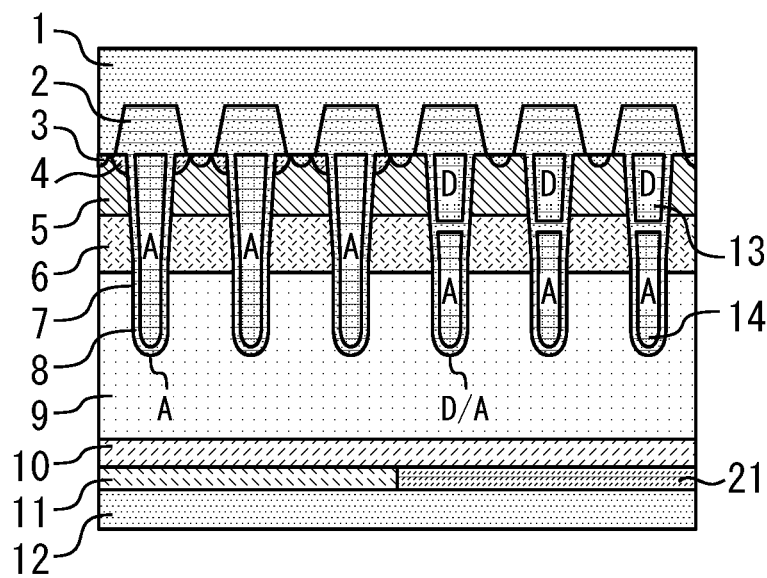
FIG. 35 is a cross-sectional view of a semiconductor device according to a seventh embodiment.

FIG. 35 is a cross-sectional view of a semiconductor device according to a seventh embodiment. The semiconductor device is a reverse conducting IGBT (RC-IGBT) having the above-described technological characteristics. The semiconductor device includes an IGBT region including the p-type collector layer 11 on a left side and includes a diode region including a n-type cathode layer 21 on a right side. In an example, a plurality of two-part dummy active trenches D/A are provided, and a larger number of two-part dummy active trenches D/A are provided in the diode region than in the IGBT region.

When the ratio of two-part dummy active trenches D/A provided in the IGBT region is smaller than the ratio of two-part dummy active trenches D/A provided in the diode region, the density of active trenches A in the IGBT region can be higher to have a higher channel density. Accordingly, conduction performance can be improved.

Modification 1

Figure 36:
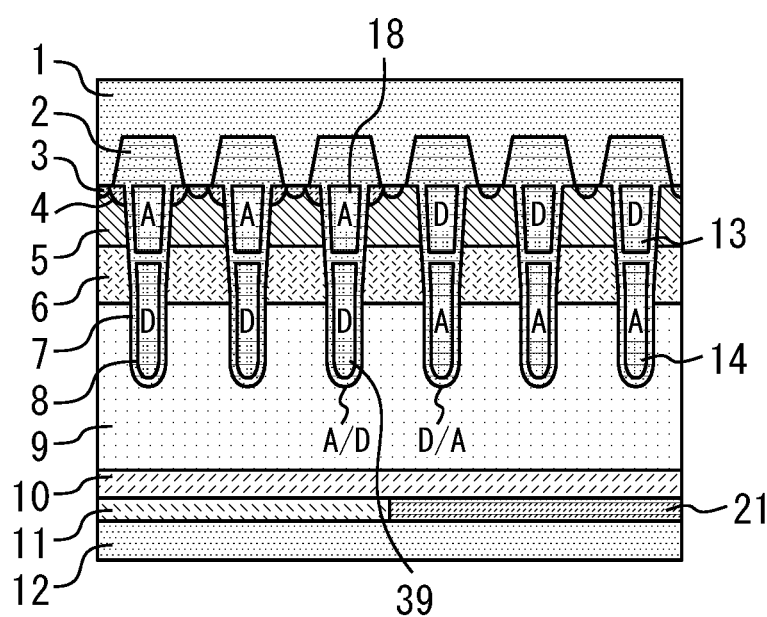
FIG. 36 is a cross-sectional view of a semiconductor device according to another example.

FIG. 36 is a cross-sectional view of a semiconductor device according to Modification 1. The semiconductor device in FIG. 36 includes an IGBT region and a diode region and thus is configured as an RC-IGBT. A plurality of two-part dummy active trenches D/A are provided in the diode region. A plurality of two-part active dummy trenches A/D are provided in the IGBT region. Each two-part active dummy trench A/D is a trench of the semiconductor substrate in which the upper active part 18 connected with the gate electrode is provided at an upper part, and a lower dummy part 39 not connected with the gate electrode and covered by the gate insulating film 8 as an insulating film is provided at a lower part.

Gate characteristics degrade through hot carrier injection into a gate oxide film on a trench bottom part of the IGBT region, which is caused by dynamic avalanche at turn-off. When each trench in the IGBT region is a two-part active dummy trench A/D, the lower part of the trench is a dummy, and thus gate characteristics do not degrade through hot carrier injection due to dynamic avalanche. In addition, the Cgc for turn-on loss reduction is increased at each two-part dummy active trench D/A provided in the diode region. Accordingly, reduction of degradation of gate characteristics due to dynamic avalanche and reduction of the turn-on loss are achieved.

Eighth Embodiment

Figure 37:
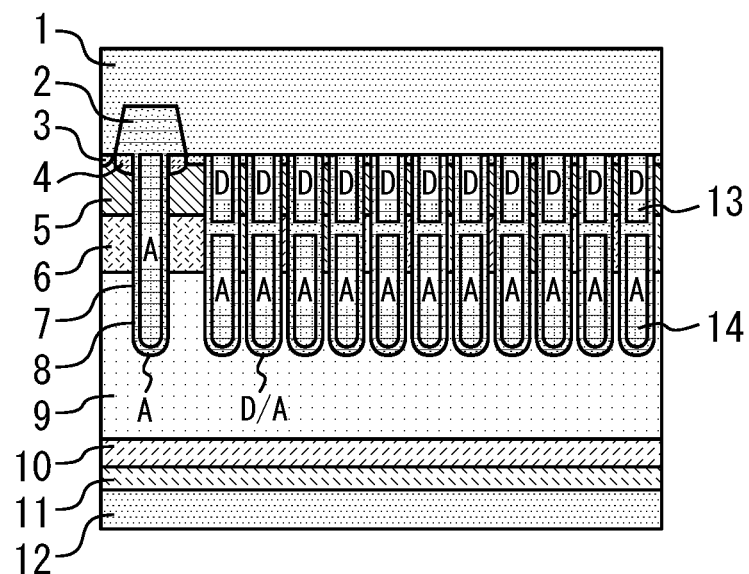
FIG. 37 is a cross-sectional view of a semiconductor device according to an eighth embodiment.

FIG. 37 is a cross-sectional view of a semiconductor device according to an eighth embodiment. Two or more two-part dummy active trench D/A are arranged side by side, and the interval between two two-part dummy active trenches D/A is smaller than the interval between an active trench and a trench adjacent to the active trench. FIG. 37 illustrates a two-part dummy active trench D/A as a "trench adjacent to an active trench", but the "trench adjacent to an active trench" may be an active trench or a dummy trench.

In this manner, the density of two-part dummy active trenches D/A is higher in the same cell pitch in the semiconductor device according to the eighth embodiment, and thus the area of a surface at which the lower active part 14 of each two-part dummy active trench D/A faces the drift layer 9 is increased. Accordingly, the Cgc can be increased.

Modification 1

Figure 38:
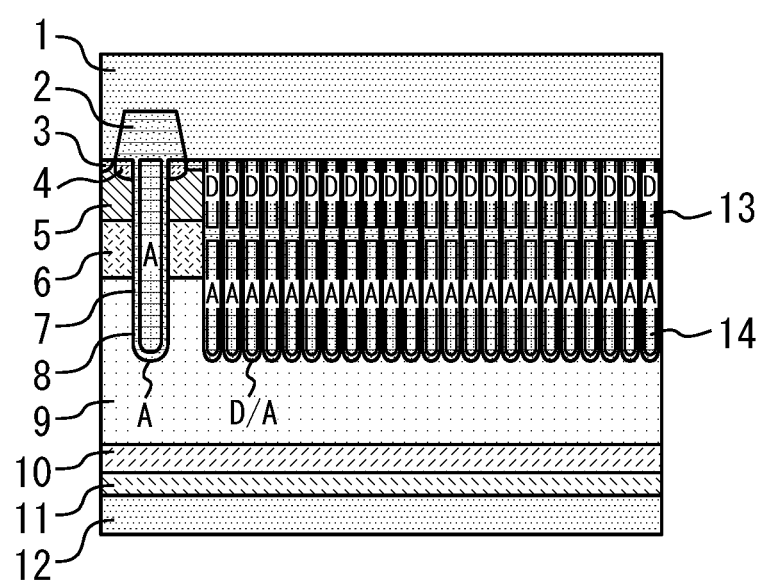
FIG. 38 is a cross-sectional view of a semiconductor device according to another example.

FIG. 38 is a cross-sectional view of a semiconductor device according to Modification 1. The width of a two-part dummy active trench D/A is smaller than the width of an active trench A. In another example, the width of a two-part dummy active trench D/A is smaller than the width of a dummy trench. In an example, as understood from FIG. 38, the pitch between two-part dummy active trenches D/A adjacent to each other is shorter than the pitch between an active trench A and a two-part dummy active trench D/A. When the width of each two-part dummy active trench D/A is smaller in this manner, the density of two-part dummy active trenches D/A is higher in the same cell pitch. Accordingly, the surface area of each two-part dummy active trench D/A is increased, and the Cgc can be increased.

Modification 2

Figure 39:
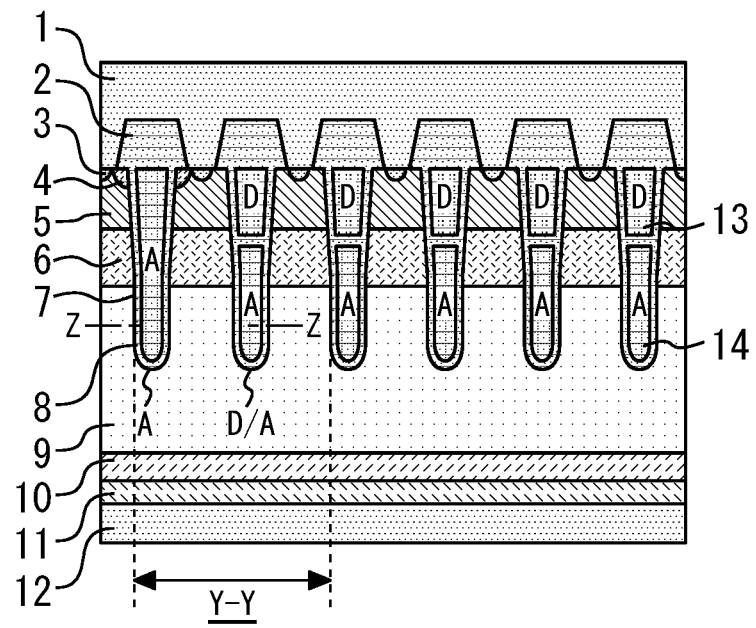
FIG. 39 is a cross-sectional view of a semiconductor device according to another example.
Figure 40:
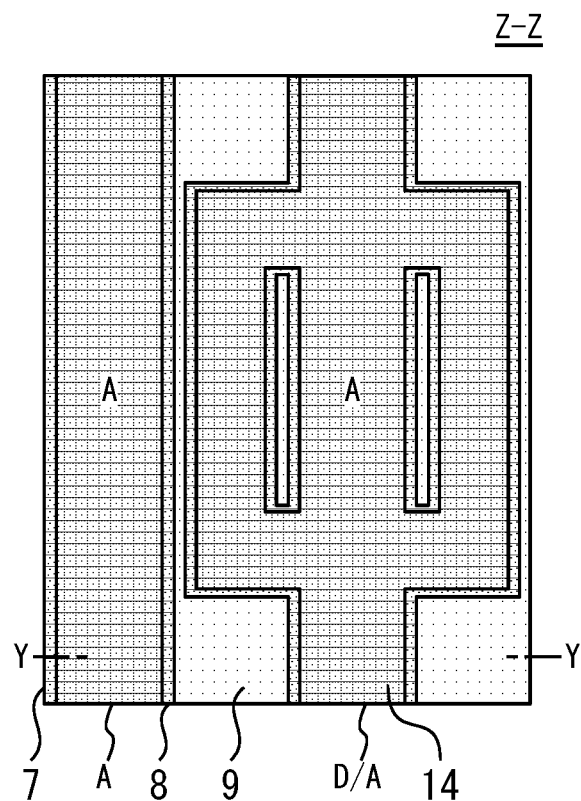
FIG. 40 is a view illustrating a planar shape of a lower active part.
Figure 41:
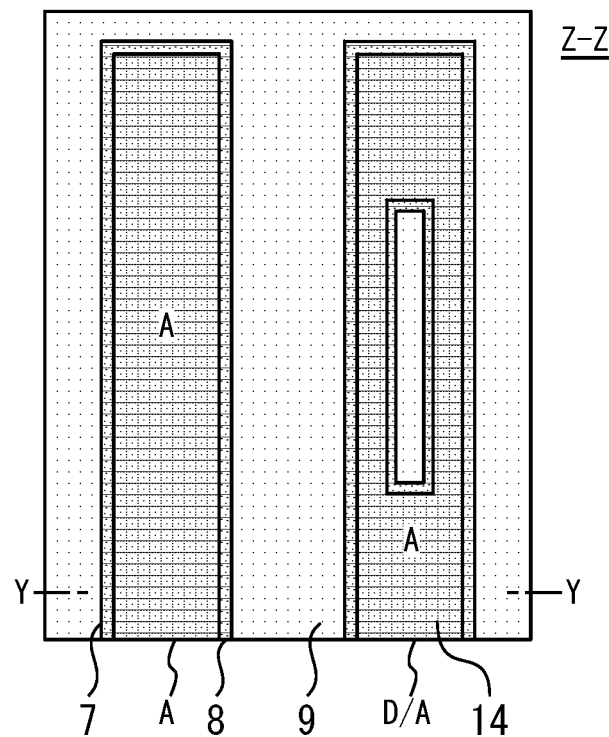
FIG. 41 is a view illustrating a planar shape of a lower active part according to another example.

FIGS. 39 to 41 are diagrams illustrating a semiconductor device according to Modification 2. FIG. 39 is a cross-sectional view, and FIG. 40 is a cross-sectional view taken along line z-z in FIG. 39. Each two-part dummy active trench D/A has a split shape in plan view. FIG. 40 illustrates that the two-part dummy active trench D/A is split into three parts in plan view.

FIG. 41 is a plan view of a two-part dummy active trench D/A according to another example. FIG. 41 corresponds to a cross-sectional view taken along line z-z in FIG. 39. In an example of FIG. 41, the two-part dummy active trench D/A includes a part having a substantially constant width and formed in an annular shape in plan view. The drift layer 9 is present at a position surrounded by the annular part of the two-part dummy active trench D/A. In other words, the two-part dummy active trench D/A has a substantially constant width as a whole but is partially formed narrower to have a split part. In an example, the part formed narrower may be provided at a central part of the two-part dummy active trench D/A.

In the configuration described with reference to FIGS. 39 to 41, the two-part dummy active trench D/A is partially split to increase the surface area of the two-part dummy active trench D/A. Accordingly, the Cgc can be increased.

Modification 3

Figure 42:
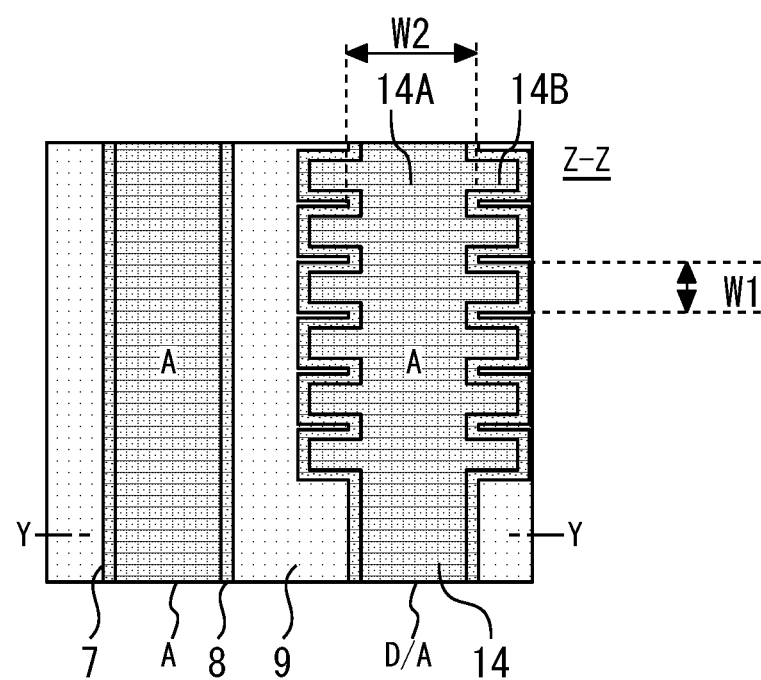
FIG. 42 is a view illustrating a planar shape of a lower active part according to another example.

FIG. 42 is a diagram illustrating a semiconductor device according to Modification 3. A two-part dummy active trench D/A includes a body part 14A, and a protrusion part 14B protruding in longitudinal and vertical directions of the body part 14A in plan view. FIG. 42 illustrates that a plurality of protrusion parts 14B are provided on right and left sides of the body part 14A.

Figure 43:
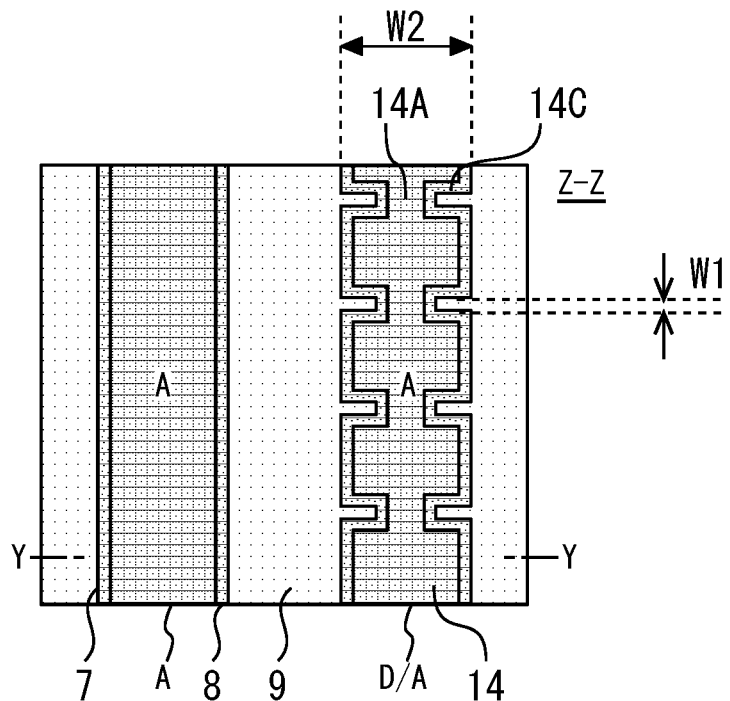
FIG. 43 is a view illustrating a planar shape of a lower active part according to another example.

FIG. 43 is a plan view of a two-part dummy active trench D/A according to another example. The two-part dummy active trench D/A includes the body part 14A, and a recessed part 14C recessed in the longitudinal and vertical directions of the body part 14A in plan view.

When the protrusion part 14B or the recessed part 14C is provided in this manner, the surface area of the two-part dummy active trench D/A can be increased as compared to a case in which the part is not provided. Accordingly, the Cgc can be increased.

In an example, the protrusion part 14B or the recessed part 14C may be refined to increase the surface area of the two-part dummy active trench D/A. For example, as illustrated in FIG. 42, a width W1 of the protrusion part 14B may be smaller than a width W2 of the body part 14A in plan view. Alternatively, as illustrated in FIG. 43, the width W1 of the recessed part 14C may be smaller than the width W2 of the body part 14A in plan view. In addition, the interval of a plurality of formed protrusion parts 14B may be shorter than the distance between a two-part dummy active trench D/A and a trench adjacent to the two-part dummy active trench D/A. Similarly, the interval of a plurality of formed recessed parts 14C may be shorter than the distance between a two-part dummy active trench D/A and a trench adjacent to the two-part dummy active trench D/A.

Modification 4

Figure 44:
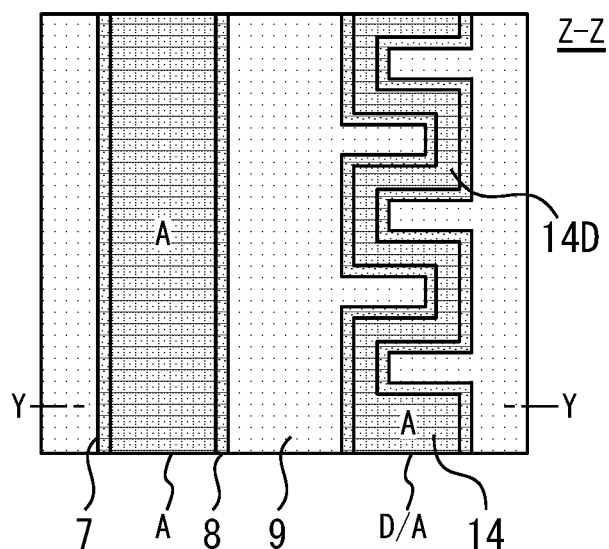
FIG. 44 is a view illustrating a planar shape of a lower active part according to another example.

FIG. 44 is a diagram illustrating a semiconductor device according to Modification 4. The two-part dummy active trench D/A includes a plurality of bend parts 14D in plan view. In an example, the two-part dummy active trench D/A includes a plurality of bend parts 14D in plan view and is provided in parallel to the active trench A as a whole. When a plurality of bend parts 14D are provided in this manner, the surface area of the two-part dummy active trench D/A is increased. Accordingly, the Cgc can be increased.

Features described above in the embodiments may be combined. Technologies described above in the embodiments are also applicable to a metal oxide semiconductor field effect transistor (MOSFET). In addition, the semiconductor substrate may be formed of a wide bandgap semiconductor. The wide bandgap semiconductor is, for example, silicon carbide, a gallium nitride material, or diamond.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-189650, filed on Nov. 13, 2020 including specification, claims, drawings and summary, on which the convention priority of the present application is based, is incorporated herein by reference in its entirety.

The invention claimed is:

1. A semiconductor device comprising;
   a semiconductor substrate;
   an emitter electrode provided on the semiconductor substrate;
   a gate electrode provided on the semiconductor substrate;
   a drift layer of a first conduction type provided in the semiconductor substrate;
   a source layer of the first conduction type provided on an upper surface side of the semiconductor substrate;
   a base layer of a second conduction type provided on the upper surface side of the semiconductor substrate;
   a collector electrode provided below the semiconductor substrate; and
   a two-part dummy active trench including, at an upper part, an upper dummy part not connected with the gate electrode and including, at a lower part, a lower active part connected with the gate electrode and covered by an insulating film, in a trench of the semiconductor substrate,
   wherein a longitudinal length of the lower active part is larger than a width of the lower active part.

2. The semiconductor device according to claim 1, comprising an active trench including a gate insulating film provided along a trench of the semiconductor substrate, and an active part provided in contact with the gate insulating film and connected with the gate electrode.

3. The semiconductor device according to claim 2, wherein the two-part dummy active trench and the active trench are formed in a cell region in which the base layer is formed in plan view.

4. The semiconductor device according to claim 2, wherein the active trench is formed in a cell region in which the base layer is formed in plan view, and
   the two-part dummy active trench is formed in a terminal end region surrounding the cell region in plan view, an outer peripheral region surrounding the terminal end region, or a gate pad region.

5. The semiconductor device according to claim 2, wherein a first structure in which two or more active trenches are arranged and a second structure in which two or more two-part dummy active trenches are arranged are alternately provided.

6. The semiconductor device according to claim 5, wherein the number of the two-part dummy active trenches is larger than the number of the active trenches.

7. The semiconductor device according to claim 2, wherein a first structure in which three or more active trenches are arranged and a second structure in which three or more two-part dummy active trenches are arranged are alternately provided.

8. The semiconductor device according to claim 2, comprising a dummy trench.

9. The semiconductor device according to claim 8, comprising a first structure in which one or more active trenches are arranged, a second structure in which two or more two-part dummy active trenches are arranged, and a third structure in which one or more dummy trenches are arranged,
 wherein the second structure is sandwiched between two third structures.

10. The semiconductor device according to claim 8, comprising a first structure in which one or more active trenches are arranged, a second structure in which one or more two-part dummy active trenches are arranged, and a third structure in which one or more dummy trenches are arranged,
 wherein the second structure is sandwiched between the first structure and the third structure.

11. The semiconductor device according to claim 8, wherein the dummy trench is divided into two parts of upper and lower parts through a middle insulating film.

12. The semiconductor device according to claim 2, wherein the two-part dummy active trenches includes a first trench in which the upper dummy part is connected with the emitter electrode and a second trench in which the upper dummy part has floating potential, and
 the second trench is sandwiched between the first trench and the active trench.

13. The semiconductor device according to claim 2, comprising a dummy trench, wherein the upper dummy part has floating potential, and
 the two-part dummy active trench is sandwiched between the dummy trench and the active trench.

14. The semiconductor device according to claim 2, wherein a distance between a first structure in which two or more two-part dummy active trenches are arranged and a second structure in which two or more active trenches are arranged is longer than a distance between two two-part dummy active trenches and longer than a distance between two active trenches.

15. The semiconductor device according to claim 2, comprising:
 a first structure in which two or more active trenches are arranged;
 a second structure that is adjacent to the first structure and in which two or more two-part dummy active trenches are arranged; and
 a dummy trench adjacent to the second structure,
 wherein a distance between the second structure and the dummy trench is longer than a distance between two active trenches, a distance between the first structure and the second structure, or a distance between two two-part dummy active trenches.

16. The semiconductor device according to claim 2, wherein part of the base layer, which is adjacent to the active trench, is connected with the emitter electrode, and
 part of the base layer, which is sandwiched between two two-part dummy active trenches, is not connected with the emitter electrode.

17. The semiconductor device according to claim 2, comprising at least one dummy trench,
 wherein part of the base layer, which is sandwiched between the two dummy trenches or between the dummy trench and the two-part dummy active trench, is not connected with the emitter electrode.

18. The semiconductor device according to claim 2, wherein part of the base layer, which is adjacent to two active trenches, is connected with the emitter electrode, and part of the base layer, which is adjacent to the two-part dummy active trench, is not connected with the emitter electrode.

19. The semiconductor device according to claim 2, wherein the active part is divided into two parts of upper and lower parts through a middle insulating film.

20. The semiconductor device according to claim 19, comprising:
 a first insulating film covering part of the active part on an upper side of the middle insulating film; and
 a second insulating film covering part of the active part on a lower side of the middle insulating film,
 wherein the first insulating film is thicker than the second insulating film.

21. The semiconductor device according to claim 19, comprising:
 a first insulating film covering part of the active part on an upper side of the middle insulating film; and
 a second insulating film covering part of the active part on a lower side of the middle insulating film,
 wherein sidewall and bottom parts of the second insulating film are thicker than the first insulating film.

22. The semiconductor device according to claim 19, wherein the gate electrode includes a first gate electrode, and a second gate electrode of a system different from that of the first gate electrode,
 part of the active part on an upper side of the middle insulating film is connected with the first gate electrode,
 part of the active part on a lower side of the middle insulating film is connected with the second gate electrode.

23. The semiconductor device according to claim 2, wherein the gate electrode includes a first gate electrode, and a second gate electrode of a system different from that of the first gate electrode,
 the active part is connected with the first gate electrode, and
 the lower active part is connected with the second gate electrode.

24. A semiconductor apparatus comprising;
 a first semiconductor device having a collector connected with a high-potential side of a power source;
 a second semiconductor device having an emitter connected with a low-potential side of the power source and a collectors connected with an emitter of the first semiconductor device, and having the same structure as the semiconductor device according to claim 23; and
 a gate drive circuit applying gate voltage to the first gate electrode and the second gate electrode through respective systems,
 wherein when a collector current of the first semiconductor device is larger than a predetermined value, the gate drive circuit applies voltage equal to or higher than a threshold value to the first gate electrode but does not apply voltage equal to or higher than the threshold value to the second gate electrode, and
 when a collector current of the first semiconductor device is smaller than the predetermined value, the gate drive circuit applies voltage equal to or higher than the threshold value to the first gate electrode and the second gate electrode.

25. The semiconductor device according to claim 2, wherein the gate electrode includes a first gate electrode, and a second gate electrode of a system different from that of the first gate electrode, the active trench includes a first active trench and a second active trench, the active part of the first active trench is connected with the first gate electrode, and the active part of the second active trench and the lower active part are connected with the second gate electrode.

26. The semiconductor device according to claim 2, wherein two or more two-part dummy active trench are arranged side by side, and an interval between the two two-part dummy active trenches is smaller than an interval between the active trench and a trench adjacent to the active trench.

27. The semiconductor device according to claim 26, wherein a width of the two-part dummy active trench is smaller than a width of the active trench.

28. The semiconductor device according to claim 26, comprising a dummy trench, wherein a width of the two-part dummy active trench is smaller than a width of the dummy trench.

29. The semiconductor device according to claim 1, wherein a longitudinal length of the lower active part is longer than a longitudinal length of the upper dummy part.

30. The semiconductor device according to claim 1, wherein a longitudinal length of the lower active part is larger than a thickness of the base layer.

31. The semiconductor device according to claim 1, wherein an upper end of the lower active part is positioned within the base layer.

32. The semiconductor device according to claim 1, comprising a carrier accumulation layer provided between the base layer and the drift layer, having lower impurity concentration of the first conduction type than that of the source layer, and having higher impurity concentration of the first conduction type than that of the drift layer.

33. The semiconductor device according to claim 32, wherein an upper end of the lower active part is positioned lower than a lower end of the carrier accumulation layer.

34. The semiconductor device according to claim 32, wherein a longitudinal length of the lower active part in the carrier accumulation layer is shorter than a longitudinal length of the lower active part in the drift layer.

35. The semiconductor device according to claim 1, wherein the upper dummy part is connected with the emitter electrode.

36. The semiconductor device according to claim 1, wherein the upper dummy part is an oxide or a metal.

37. The semiconductor device according to claim 1, wherein the upper dummy part is in contact with the base layer.

38. The semiconductor device according to claim 1, wherein the upper dummy part has floating potential.

39. The semiconductor device according to claim 1, comprising a third insulating film covering the upper dummy part, wherein sidewall and bottom parts of the insulating film covering the lower active part are thicker than the third insulating film.

40. The semiconductor device according to claim 1, wherein the semiconductor device includes an IGBT region and a diode region and is configured as an RC-IGBT, a plurality of two-part dummy active trenches are provided, and a larger number of two-part dummy active trenches are provided in the diode region than in the IGBT region.

41. The semiconductor device according to claim 1, wherein the semiconductor device is configured as a MOSFET.

42. The semiconductor device according to claim 1, wherein the semiconductor substrate is formed of a wide bandgap semiconductor.

43. The semiconductor device according to claim 42, wherein the wide bandgap semiconductor is silicon carbide, a gallium nitride material, or diamond.

44. The semiconductor device according to claim 1, wherein a longitudinal length of the lower active part is shorter than a longitudinal length of the upper dummy part.

45. The semiconductor device according to claim 1, wherein the two-part dummy active trench has a split shape in plan view.

46. The semiconductor device according to claim 1, wherein the two-part dummy active trench includes a part having a substantially constant width and formed in an annular shape in plan view.

47. The semiconductor device according to claim 1, wherein the two-part dummy active trench includes a body part, and a protrusion part protruding perpendicular to a longitudinal direction of the body part in plan view or a recessed part recessed perpendicular to a longitudinal direction of the body part in plan view.

48. The semiconductor device according to claim 47, wherein a width of the protrusion part or the recessed part is smaller than a width of the body part in plan view.

49. The semiconductor device according to claim 48, wherein a plurality of the protrusion parts are formed in plan view, and an interval of the protrusion parts is shorter than a distance between the two-part dummy active trench and a trench adjacent to the two-part dummy active trench.

50. The semiconductor device according to claim 48, wherein a plurality of the recessed parts are formed in plan view, and an interval of the recessed parts is shorter than a distance between the two-part dummy active trench and a trench adjacent to the two-part dummy active trench.

51. The semiconductor device according to claim 1, wherein the two-part dummy active trench includes a plurality of bend parts in plan view.

52. The semiconductor device according to claim 1, wherein part of the base layer sandwiched between two two-part dummy active trenches is connected with the emitter electrode.

53. The semiconductor device according to claim 1, wherein a plurality of the two-part dummy active trenches are provided, the base layer is divided into a plurality of base parts, and the plurality of base parts include a base part connected with the emitter electrode and a base part not connected with the emitter electrode.

54. The semiconductor device according to claim 1, comprising two dummy trenches, wherein part of the base layer, which is sandwiched between two dummy trenches, is not connected with the emitter electrode, and part of the base layer, which is sandwiched between two two-part dummy active trenches, is connected with the emitter electrode.

55. The semiconductor device according to claim 1, wherein the semiconductor device includes an IGBT region and a diode region and is configured as an RC-IGBT, a plurality of the two-part dummy active trenches are provided in the diode region, and a plurality of two-part active dummy trenches including, at an upper part, an upper active part connected with the gate electrode and including, at a lower part, a lower dummy part not connected with the gate electrode and covered by an insulating film, in a trench of the semiconductor substrate in the IGBT region.

56. The semiconductor device according to claim 1, wherein an upper end of the lower active part is positioned lower than a lower end of the base layer.

57. A semiconductor device comprising;
a semiconductor substrate;
an emitter electrode provided on the semiconductor substrate;
a gate electrode provided on the semiconductor substrate;
a drift layer of a first conduction type provided in the semiconductor substrate;
a source layer of the first conduction type provided on an upper surface side of the semiconductor substrate;
a base layer of a second conduction type provided on the upper surface side of the semiconductor substrate;
a collector electrode provided below the semiconductor substrate; and
a three-part trench which is a trench of the semiconductor substrate in which a first dummy part connected with the emitter electrode is provided at an upper part, an active part connected with the gate electrode is provided at a middle part, and a second dummy part connected with the emitter electrode is provided at a lower part.

* * * * *